(12) United States Patent
Kato

(10) Patent No.: US 11,114,392 B2
(45) Date of Patent: Sep. 7, 2021

(54) WIRELESS COMMUNICATION DEVICE

(71) Applicant: Murata Manufacturing Co., Ltd., Nagaokakyo (JP)

(72) Inventor: Noboru Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 225 days.

(21) Appl. No.: 16/423,382

(22) Filed: May 28, 2019

(65) Prior Publication Data

US 2019/0280366 A1  Sep. 12, 2019

Related U.S. Application Data

(63) Continuation of application No. PCT/JP2018/036232, filed on Sep. 28, 2018.

(30) Foreign Application Priority Data

Sep. 29, 2017 (JP) .............................. JP2017-191521

(51) Int. Cl.
*H01L 23/66* (2006.01)
*G06K 19/07* (2006.01)
(Continued)

(52) U.S. Cl.
CPC ............ *H01L 23/66* (2013.01); *G06K 19/077* (2013.01); *G06K 19/0723* (2013.01);
(Continued)

(58) Field of Classification Search
CPC ............. H01L 23/66; H01L 2223/6672; H01L 2223/6677; H01Q 1/22; H01Q 1/2225;
(Continued)

(56) References Cited

U.S. PATENT DOCUMENTS 5,903,239 A * 5/1999 Takahashi ............ H01Q 1/2283
343/700 MS
6,018,299 A * 1/2000 Eberhardt ........ G06K 19/07743
340/572.7
(Continued)

FOREIGN PATENT DOCUMENTS

EP 2410565 A1 1/2012
JP 2005191705 A 7/2005
(Continued)

OTHER PUBLICATIONS

International Search Report issued for PCT/JP2018/036232, dated Dec. 11, 2018.
(Continued)

*Primary Examiner* — Scott B Geyer
(74) *Attorney, Agent, or Firm* — Arent Fox LLP

(57) ABSTRACT

A wireless communication device that includes a first electrode connected to a first terminal electrode of an RFIC element and a second electrode connected to a second terminal electrode of the RFIC element. Moreover, the first electrode has a longitudinal direction and a lateral direction and has a first portion connected to the first terminal electrode and a second portion that faces the first portion and the second electrode. The first portion has an extended portion that extends in the longitudinal direction beyond a connection point between the second electrode and the second terminal electrode.

20 Claims, 15 Drawing Sheets

(51) Int. Cl.
G06K 19/077 (2006.01)
H01L 23/14 (2006.01)
H01L 23/31 (2006.01)
H01L 23/498 (2006.01)
H01L 23/544 (2006.01)
H01Q 1/22 (2006.01)
H01Q 1/24 (2006.01)
H01L 23/552 (2006.01)

(52) U.S. Cl.
CPC ........ G06K 19/0775 (2013.01); H01L 23/145 (2013.01); H01L 23/3121 (2013.01); H01L 23/4985 (2013.01); H01L 23/49855 (2013.01); H01L 23/544 (2013.01); H01Q 1/22 (2013.01); H01Q 1/24 (2013.01); H01L 23/552 (2013.01); H01L 2223/6616 (2013.01); H01L 2223/6677 (2013.01)

(58) Field of Classification Search
CPC .... H01Q 1/2283; H01Q 1/2291; H01Q 1/243; H01Q 1/38; H01Q 9/42; H01Q 9/36; H01Q 9/0414; H01Q 9/30; G06K 19/07745; G06K 19/07747; G06K 19/0775; G06K 19/07754; G06K 19/07773; G06K 19/0779; G06K 19/07792
See application file for complete search history.

(56) References Cited

U.S. PATENT DOCUMENTS

| | | | | |
|---|---|---|---|---|
| 7,298,343 B2 * | 11/2007 | Forster | ............. | G06K 19/07749 343/767 |
| 8,477,079 B2 * | 7/2013 | Carr | ..................... | H01Q 1/2225 343/904 |
| 9,489,611 B1 * | 11/2016 | Diorio | .............. | G06K 19/07752 |
| 2006/0032926 A1 * | 2/2006 | Baba | ..................... | H01Q 1/2216 235/492 |
| 2007/0229276 A1 | 10/2007 | Yamagajo et al. | | |
| 2007/0238245 A1 * | 10/2007 | Cote | .................. | H01L 21/4853 438/243 |
| 2008/0174494 A1 * | 7/2008 | Suzuki | ................... | H01Q 1/243 343/700 MS |
| 2008/0284605 A1 * | 11/2008 | Shafer | ................ | G06K 19/0726 340/572.7 |
| 2010/0038433 A1 * | 2/2010 | Ikemoto | ........... | G06K 19/07749 235/492 |
| 2011/0279326 A1 * | 11/2011 | Dokai | ..................... | H01Q 7/00 343/700 MS |
| 2013/0270348 A1 * | 10/2013 | Zenz | ....................... | H01L 21/56 235/488 |
| 2016/0056544 A1 * | 2/2016 | Garcia | .................. | H01Q 21/28 343/725 |
| 2018/0137399 A1 | 5/2018 | Kato | | |

FOREIGN PATENT DOCUMENTS

JP  2007272264 A  10/2007
WO  2017014151 A1  1/2017

OTHER PUBLICATIONS

International Search Report issued for PCT/JP2018/036232, dated Dec. 11, 2018 (in Japanese).
Written Opinion of the International Searching Authority issued for PCT/JP2018/036232, dated Dec. 11, 2018.

* cited by examiner

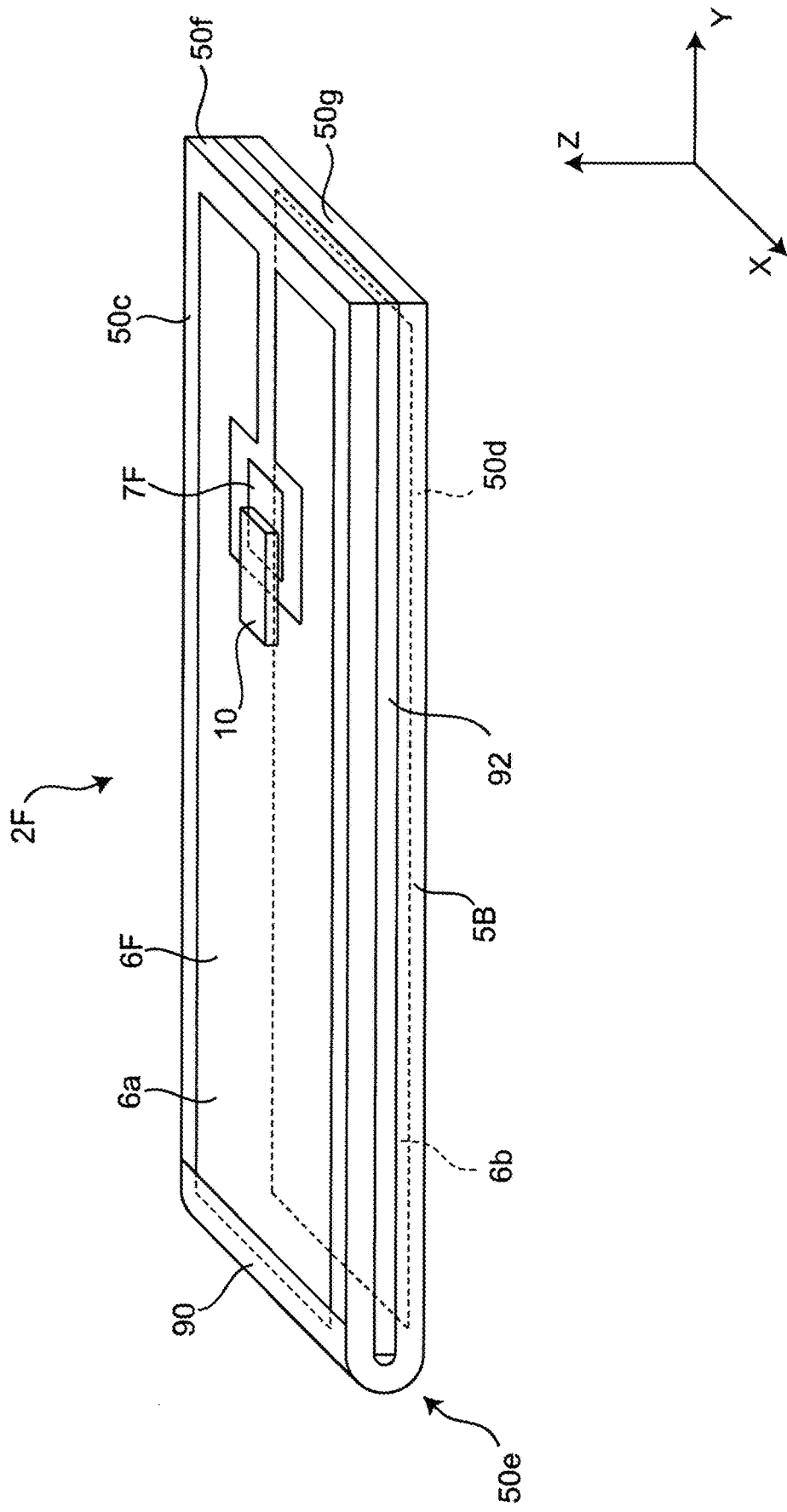

US 11,114,392 B2

WIRELESS COMMUNICATION DEVICE

CROSS REFERENCE TO RELATED APPLICATIONS

The present application is a continuation of PCT/JP2018/036232 filed Sep. 28, 2018, which claims priority to Japanese Patent Application No. 2017-191521, filed Sep. 29, 2017, the entire contents of each of which are incorporated herein by reference.

TECHNICAL FIELD

The present invention relates to a wireless communication device using an RFID (Radio Frequency Identification) technique and, more particularly, to a wireless communication device attached to a metal surface of an article to perform wireless communication.

BACKGROUND

A conventional wireless communication device capable of being attached to a metal surface of an article and performing wireless communication are described in Patent Document 1 (identified below), for example. The wireless communication device described in Patent Document 1 is formed by disposing a first electrode and a second electrode on a front surface of a thin plate-shaped dielectric substrate and connecting the first electrode and the second electrode by an RFIC (Radio-Frequency Integrated Circuit) element. A back surface of the dielectric substrate is provided with a back-surface electrode formed of a belt-shaped metal film connected to the first electrode formed on the front surface, and the back-surface electrode is configured to be opposite to the first electrode and the second electrode formed on the front surface across the dielectric substrate.

The conventional wireless communication device configured as described above is configured to be affixed such that the back-surface electrode capacitively couples to a metal surface of an article and that the metal surface is used as an antenna for performing wireless communication.

Patent Document 1: WO 2017/014151.

A wireless communication device using an RFID technique is configured to be attached to an article to read/write information on the article and is therefore required to have a configuration with high radiation efficiency, a long communication distance, and excellent communication characteristics. Particularly, if a wireless communication device is attached to a metal surface of an article in use and utilizes the metal surface as an antenna, the device is required to allow the metal surface having the wireless communication device attached thereto to highly efficiently function as an antenna and is required to have a long communication distance and exhibit excellent communication characteristics.

For example, on the front surface of the dielectric substrate of the wireless communication device described in Patent Document 1, the first electrode and the second electrode are disposed at positions separated in shape (physically) in regions on both sides with the RFIC element interposed therebetween. In such a wireless communication device, the formation position of the second electrode must be ensured at a position separated from the first electrode on the front surface side of the dielectric substrate, so that the entire surface on the front surface side of the dielectric substrate is not efficiently used in this configuration. A configuration desired in the field of wireless communication devices, particularly, for RFID tags, is a simple thinly-formed configuration manufactured at low cost and exhibiting excellent communication characteristics with a long communication distance.

SUMMARY OF THE INVENTION

Accordingly, it is an object of the present invention is to provide a wireless communication device that allows a metal surface of an article to highly efficiently function as an antenna while the wireless communication device is attached to the metal surface of the article and thereby performing wireless communication with excellent communication characteristics, as compared to a conventional wireless communication device.

An exemplary aspect of the present invention provides a wireless communication device including an RFIC element including a first terminal electrode and a second terminal electrode; a first electrode connected to the first terminal electrode; and a second electrode connected to the second terminal electrode. Moreover, the first electrode has a longitudinal direction and a lateral direction and includes a first portion connected to the first terminal electrode and a second portion facing the first portion and the second electrode, and the first portion includes an extended part extending in the longitudinal direction beyond a position of connection between the second electrode and the second terminal electrode.

The exemplary embodiments of the present invention provide the wireless communication device configured for enabling a metal surface of an article to highly efficiently function as an antenna while the wireless communication device is attached to the metal surface of the article and thereby performing wireless communication with excellent communication characteristics, as compared to a conventional wireless communication device.

BRIEF DESCRIPTION OF DRAWINGS

FIG. 16 is a perspective view showing a configuration of a wireless communication module in a wireless communication device of a seventh exemplary embodiment.

DETAILED DESCRIPTION

Figure 1:
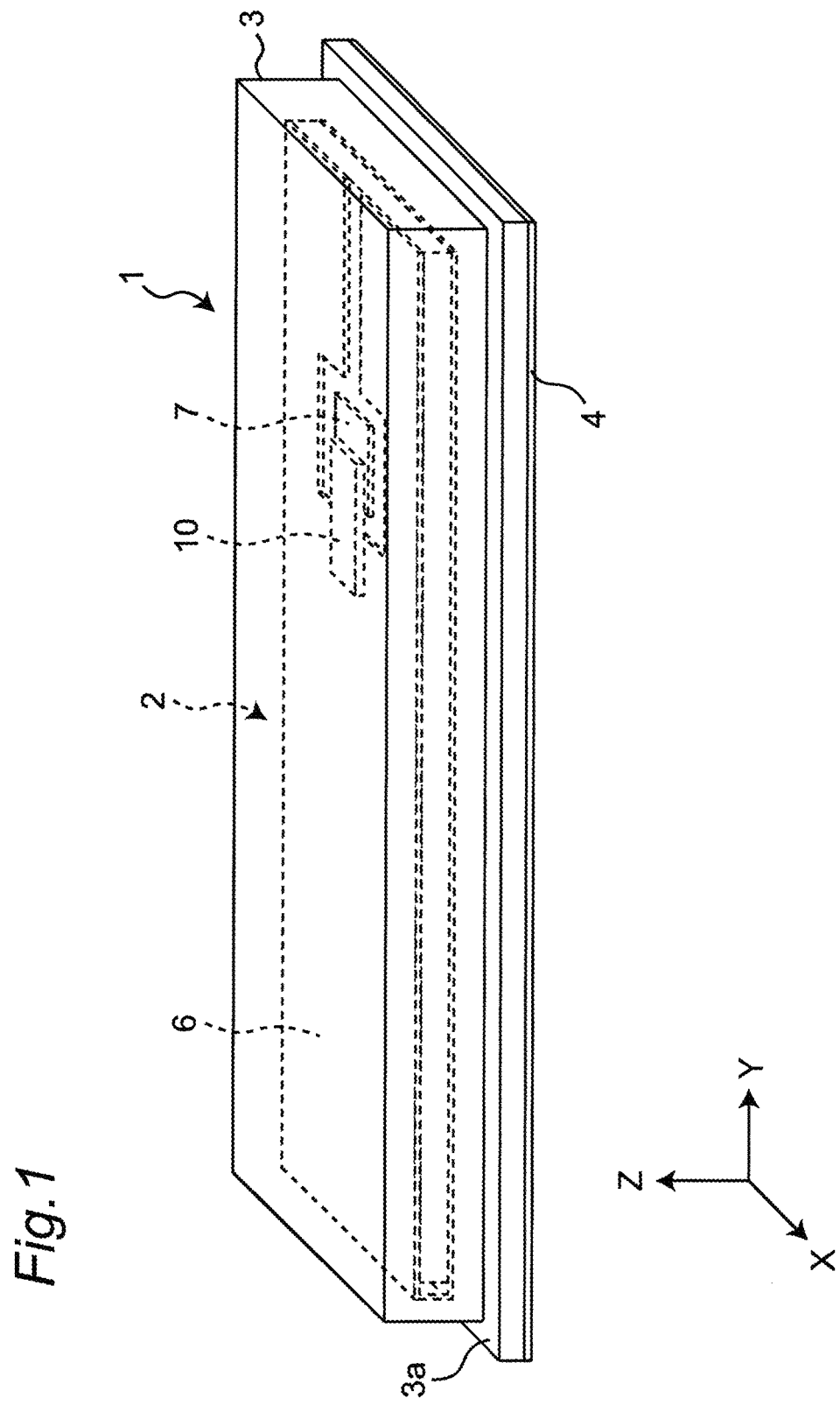
FIG. 1 is a perspective view showing a wireless communication device according to a first exemplary embodiment.

Configurations of various exemplary aspects of the wireless communication device according to the present invention will first be described.

A first exemplary aspect provides a wireless communication device including an RFIC element including a first terminal electrode and a second terminal electrode; a first electrode connected to the first terminal electrode; and a second electrode connected to the second terminal electrode, wherein the first electrode has a longitudinal direction and a lateral direction and includes a first portion connected to the first terminal electrode and a second portion facing the first portion and the second electrode. Moreover, the first portion includes an extended part extending in the longitudinal direction beyond a position of connection between the second electrode and the second terminal electrode.

While the wireless communication device of the first exemplary aspect configured as described above is attached to a metal surface of an article, the metal surface of the article functions highly efficiently function as an antenna, so that wireless communication with excellent communication characteristics can be performed.

In the wireless communication device of a second exemplary aspect, the extended part may be configured to extend in the longitudinal direction beyond a formation position of the second electrode in the first aspect.

In the wireless communication device of a third exemplary aspect, the extended part may be configured to include a region extending in the lateral direction in a region extending in the longitudinal direction beyond the formation position of the second electrode in the first or second aspect.

In the wireless communication device of a fourth exemplary aspect, the second electrode may be surrounded by the extended part, and the extended part may be configured to include a cutout part linking an inner edge and an outer edge of the extended part in the third aspect.

In the wireless communication device of a fifth exemplary aspect, a facing area of the extended part facing the second portion may be made larger than a facing area of the second electrode facing the second portion in any one of the first to fourth aspects.

In the wireless communication device of a sixth exemplary aspect, the second portion may be connected on the one end side of the first portion in the longitudinal direction, and the extended part may be formed on the other end side of the first portion in any one of the first to fifth aspects.

A wireless communication device of a seventh exemplary aspect comprises a dielectric element body including a front surface and a back surface, the first portion of the first electrode and the second electrode may be disposed on the front surface of the dielectric element body, and the second portion of the first electrode may be disposed on the back surface of the dielectric element body in any one of the first to sixth aspects.

The wireless communication device of an eighth exemplary aspect comprises a dielectric element body in a folded state, the first portion of the first electrode and the second electrode may be disposed on one outer side surface of the dielectric element body, and the second portion of the first electrode may be disposed on the other outer side surface of the dielectric element body in any one of the first to sixth aspects.

In the wireless communication device of a ninth exemplary aspect, portions facing each other in the dielectric element body may sandwich an intervening member having a permittivity lower than the dielectric element body in the eighth aspect.

In the wireless communication device of a tenth exemplary aspect, the first portion and the second portion may be made up of one metal film in any one of the first to ninth aspects.

In the wireless communication device of an eleventh exemplary aspect, the first portion and the second portion may separately be formed and may be configured to be connected by a connection conductor in any one of the first to ninth aspects.

The wireless communication device of a twelfth exemplary aspect comprises a seal material disposed to cover a region of connection of the first portion and the second electrode to the RFIC element in any one of the first to eleventh aspects.

In the wireless communication device of a thirteenth exemplary aspect, the second electrode may include a projecting part disposed inside the cutout part in the fourth aspect.

The wireless communication device of a fourteenth exemplary aspect comprises a floating electrode disposed inside the cutout part and disposed at a predetermined distance from the first electrode and the second electrode in the fourth aspect.

The wireless communication device of a fifteenth exemplary aspect comprises a printable display label disposed to cover the RFIC element as well as the first portion and the second electrode connected to the RFIC element in any one of the first to fourteenth aspects.

The wireless communication device of a sixteenth exemplary aspect comprises a protective case made of a flexible material and housing at least a wireless communication module made up of the RFIC element, the first electrode, and the second electrode in any one of the first to fourteenth aspects.

Specific exemplary embodiments of a wireless communication device according to the present invention will now be described with reference to the accompanying drawings. A wireless communication device of the following exemplary embodiments will be described in terms of an RFID (Radio Frequency Identification) tag configured to perform communication at a carrier frequency of the UHF band, for example, 900 MHz; however, the carrier frequency of the wireless communication device according to the present invention is not specified to this frequency band and the wireless communication device is configured to be applicable in other frequency bands.

First Exemplary Embodiment

FIG. 1 is a perspective view showing a wireless communication device 1 according to a first exemplary embodiment. To facilitate understanding of the exemplary embodiments of the invention, it is noted that the drawings show an X-Y-Z coordinate system including X, Y and Z axes orthogonal to each other. In this description, Z-, X-, and Y-axis directions are defined as a thickness direction, a width direction (lateral direction), and a length direction (longitudinal direction), respectively, of the wireless communication device having a rectangular shape, although it should be appreciated that these axes may change depending on the orientation of the device 1.

As shown, the wireless communication device 1 of in FIG. 1 is an RFID tag configured to perform wireless communication at a carrier frequency of the UHF band, for example, 900 MHz, and is configured to be attached to various articles before use and, particularly, the device is configured for wireless communication even when attached to a metal surface of an article (e.g., a metal body).

As shown in FIG. 1, the wireless communication device 1 includes a wireless communication module 2 performing wireless communication, a protective case 3 housing and protecting the wireless communication module 2, and a sticking member 4 disposed on a back surface of the protective case 3 for attaching the protective case 3 to an article.

The protective case 3 is made of a flexible material, for example, an epoxy resin, and houses the wireless communication module 2 such that the module is entirely covered. The protective case 3 also includes an attachment part 3a configured to be attached to the article. The attachment part 3a is provided with the sticking member 4 for attaching the wireless communication device 1 to the article. The protective case 3 has flexibility and is therefore configured such that even if an affixing surface of the article is a curved surface, the protective case can be bent and attached along the curved surface.

Figure 2:
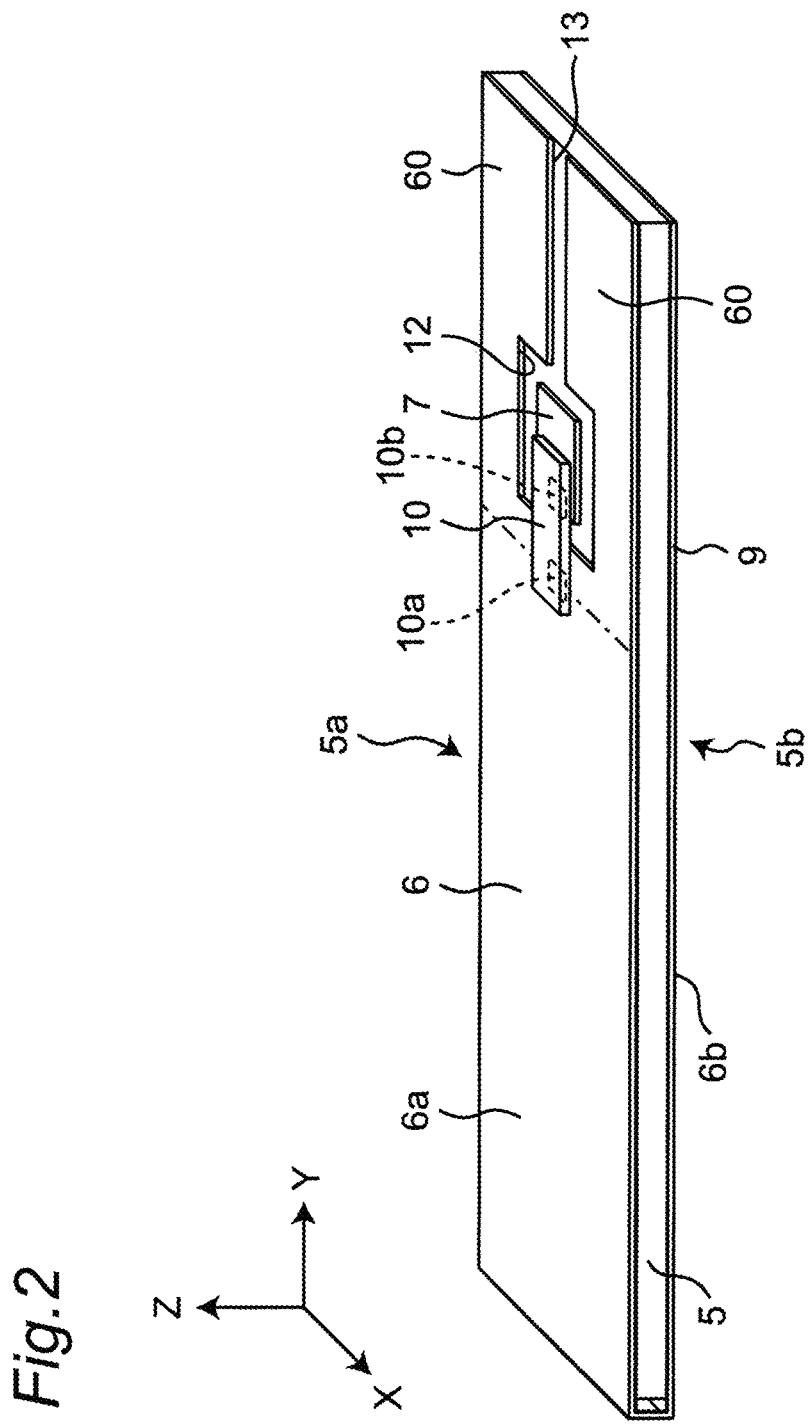
FIG. 2 is a perspective view showing a wireless communication module in the wireless communication device according to the first exemplary embodiment.
Figure 3:
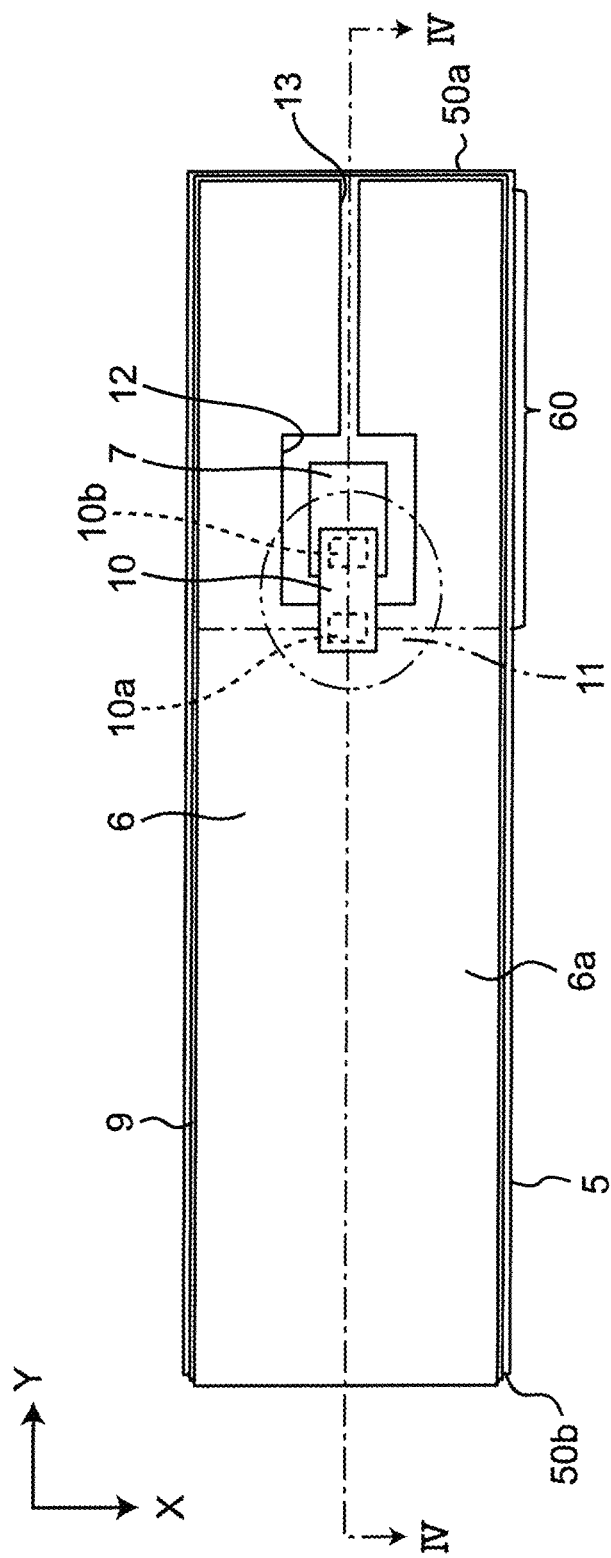
FIG. 3 is a plan view of the wireless communication module in the wireless communication device according to the first exemplary embodiment.
Figure 4:
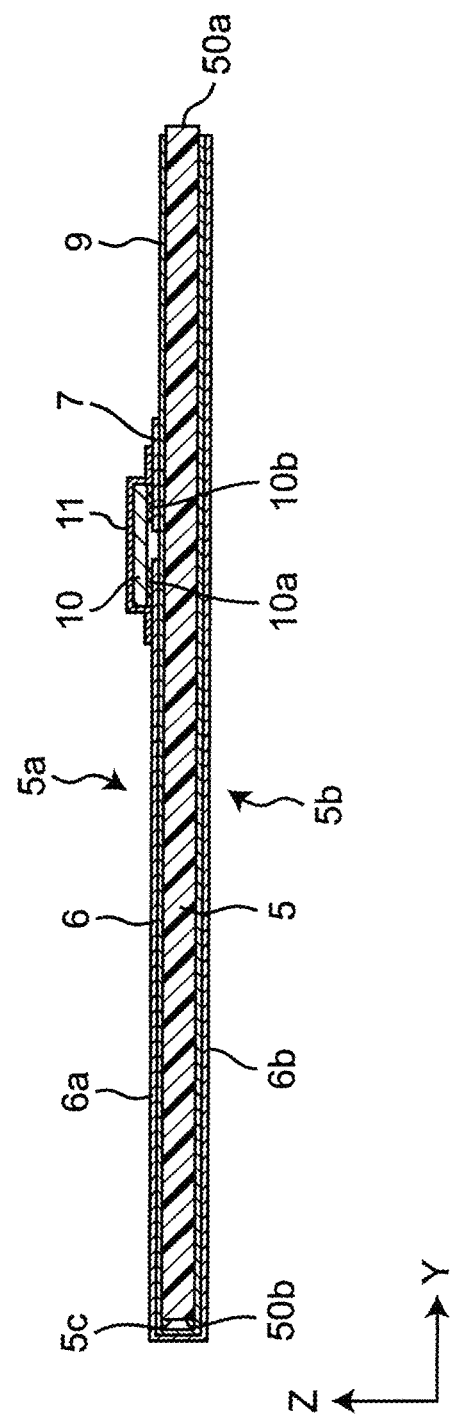
FIG. 4 is a cross-sectional view taken along a line IV-IV in the wireless communication module of FIG. 3.

FIG. 2 is a perspective view showing the wireless communication module 2 in the wireless communication device 1. FIG. 3 is a plan view of the wireless communication module 2. FIG. 4 is a cross-sectional view taken along a line IV-IV of the wireless communication module 2 of FIG. 3.

As shown in FIGS. 2 and 3, the wireless communication module 2 includes a dielectric element body 5 having an elongated rectangular shape, a first electrode 6 and a second electrode 7 disposed on the dielectric element body 5, and an RFIC (Radio Frequency Integrated Circuit) element 10 connected to the first electrode 6 and the second electrode 7.

The first electrode 6 is formed on both the front and back surfaces of the dielectric element body 5. The first electrode 6 has a first portion 6a (or first surface or front-surface electrode) formed on a front surface 5a side of the dielectric element body 5 and a second portion 6b (or second surface) formed on a back surface 5b side as a back-surface electrode. The second portion 6b (back-surface electrode) of the first electrode 6 is formed substantially entirely over the back surface 5b of the dielectric element body 5. Therefore, the second portion 6b (back-surface electrode) of the first electrode 6 is arranged to face the first portion 6a of the first electrode 6 and the second electrode 7 via the dielectric element body 5. According to the exemplary aspect, the first portion 6a and the second portion 6b of the first electrode 6 are formed or otherwise comprise one continuous metal film. Therefore, the first portion 6a and the second portion 6b of the first electrode 6 have an integrated configuration connected in terms of a direct current and is configured to suppress a transmission loss at high frequency.

As shown in FIG. 3, the first portion 6a of the first electrode 6 formed on the front surface 5a of the dielectric element body 5 has a shape with a length in the Y-axis direction (longitudinal direction) longer than that in the X-axis direction (lateral direction) and is formed over the entire region to both side end portions (i.e., side edges or ends) in the longitudinal direction of the dielectric element body 5. The first portion 6a of the first electrode 6 has a rectangular opening 12 formed in an intermediate region in the longitudinal direction. In this case, the intermediate region refers to a wide region that includes a central portion in the longitudinal direction and that is other than portions corresponding to both side end portions.

Additionally, a slit-shaped cutout part 13 extends from one side of an inner edge of the first portion 6a forming the opening 12 to an outer edge of the first portion 6a. Therefore, the inner edge forming the opening 12 formed in the first portion 6a is connected through the cutout part 13 to the outer edge of the first portion 6a.

As shown in FIG. 3, the second electrode 7 is formed inside the opening 12 formed in the first portion 6a of the first electrode 6. A predetermined interval exists between an outer edge of the second electrode 7 and the inner edge of the opening 12. In the configuration of the first embodiment, the second electrode 7 is substantially surrounded by the first portion 6a of the first electrode 6. Therefore, in the intermediate region of the first portion 6a of the first electrode 6, external connection terminals (a first terminal electrode 10a and a second terminal electrode 10b) of an RFIC element 10 are connected to the first electrode 6 and the second electrode 7 respectively.

The first portion 6a of the first electrode 6 has an extended part 60 that extends from a position of connection (i.e., a connection point) of the first terminal electrode 10a of the RFIC element 10 toward a first end 50a side (right end side in FIG. 3) in the longitudinal direction of the dielectric element body 5. This extended part 60 is formed to a position near the outer edge of the first end 50a (the right end in FIG. 3) in the longitudinal direction of the dielectric element body 5. As shown in FIGS. 2 and 3, although the opening 12 and the cutout part 13 are formed in the extended part 60, the facing area of the extended part 60 with respect to the second portion 6b serving as the back-surface electrode is larger than the facing area of the second electrode 7 with respect to the second portion 6b. In the configuration of the first embodiment, the extended part 60 is formed to largely extend from both sides of the arrangement position of the second electrode 7 toward the first end 50a side (the right end side in FIG. 3). Therefore, the extended part 60 is formed to extend toward the first end 50a side to surround both sides of the second electrode 7 and has the first end 50a side-portion divided into two by the opening 12 and the cutout part 13. In each of these two divided extended parts 60, the facing area with respect to the second portion 6b (back-surface electrode) is made larger than the facing area of the second electrode 7 with respect to the second portion 6b.

In the configuration of the first embodiment, the length in the X-axis direction (i.e., the width direction) of the first portion 6a is made substantially equal to the sum of the lengths in the X-axis direction (i.e., width direction) of the two divided regions on the first end 50a side (the right end side in FIG. 3) of the extended part 60. Therefore, the first portion 6a of the first electrode 6 are configured to be capacitively coupled through the dielectric element body 5 substantially wholly uniformly to the second portion 6b (back-surface electrode).

In the first embodiment, the dielectric element body 5 of the wireless communication module 2 has a rectangular thin plate shape in a planar view including the front surface 5a and the back surface 5b. The dielectric element body 5 has flexibility and is made of a dielectric material having a low permittivity (preferably a relative permittivity of 10 or less). The dielectric element body 5 is made of a dielectric material such as polyethylene terephthalate (PET), fluorine resin, urethane resin, and paper, for example. Moreover, the dielectric element body 5 can be comprises of a magnetic material. The dielectric element body 5 can further be comprised of a shock absorbing member having a cushioning property or an elastic member.

The first electrode 6 (the first portion 6a, the second portion 6b) and the second electrode 7 disposed on the dielectric element body 5 are copper films or aluminum films, for example, and are made of a flexible and conductive material. In the configuration of the first embodiment, due to a method of manufacturing the wireless communication module 2, the first electrode 6 (the first portion 6a, the second portion 6b) and the second electrode 7 are disposed via a film base material 9 on the dielectric element body 5.

Specifically, in the method of manufacturing the wireless communication module 2, the first electrode 6 (the first portion 6a, the second portion 6b) and the second electrode 7 are first formed on a front surface of the belt-shaped elongated film base material 9 made of a flexible material such as polyethylene terephthalate. The first electrode 6 (the first portion 6a and the second portion 6b) is made up of one belt-shaped metal film.

The RFIC element 10 is then connected via a conductive bonding material such as solder to the first portion 6a of the first electrode 6 and the second electrode 7 formed on the front surface of the film base material 9 and is mounted on the film base material 9. Subsequently, the back surface of the film base material 9 having the RFIC element 10 mounted thereon is affixed in a substantially half region on one end side in the longitudinal direction (a region provided with the first portion 6a) to the entire surface on the front surface 5a side of the dielectric element body 5. The remaining approximately half region on the other end side of the film base material 9 (the region provided with the second portion 6b) is bent and affixed to the back surface 5b side of the dielectric element body 5. As described above, the film base material 9 having the RFIC element 10 mounted thereon is bent at a substantially intermediate portion in the longitudinal direction and is affixed to both the front and back surfaces of the dielectric element body 5 to complete the wireless communication module 2 including the first electrode 6 (the first portion 6a, the second portion 6b), the second electrode 7, and the RFIC element 10.

In the wireless communication module 2 in the first embodiment, as shown in FIGS. 3 and 4, a seal material 11 is attached to cover the whole of the RFIC element 10 connected to the first portion 6a of the first electrode 6 and the second electrode 7, i.e., to cover a region of connection of the first portion 6a and the second electrode 7 to the RFIC element 10. Advantageously, the seal material 11 reliably maintains a state of connection of the RFIC element 10 to the electrodes (6, 7) and prevents falling-off from the electrodes (6, 7).

In the configuration of the first embodiment, by manufacturing the wireless communication module 2 as described above, the first portion 6a of the first electrode 6 and the second portion 6b (back-surface electrode) can comprise a single metal film. By using such a manufacturing method, the electrodes can be formed by a simple method in the first embodiment, and the first portion 6a of the first electrode 6 and the second portion 6b (back-surface electrode) are connected in terms of a direct current and therefore configured to suppress the transmission loss at high frequency between the first portion 6a and the second portion 6b (back-surface electrode).

As shown in the cross-sectional view of FIG. 4, the bent intermediate portion of the film base material 9 affixed to both surfaces of the dielectric element body 5 is arranged separately from an end surface 5c (left side end surface in FIG. 4) of the dielectric element body 5 parallel to the X axis direction (lateral direction). This is because if the film base material 9 is affixed to the end surface 5c of the dielectric element body 5, the film base material 9 is possibly partially peeled off from at least one of the front surface 5a and the back surface 5b of the dielectric element body 5 when the dielectric substrate 20 of the wireless communication module 2 is bent. If a portion of the film base material 9 is peeled off, distances varies between the first portion 6a and the second portion 6b of the first electrode 6 and between the second electrode 7 and the second portion 6b of the first electrode 6, thereby changing a stray capacity therebetween. Consequently, the communication characteristics of the wireless communication module 2 may change.

As shown in a modification of FIG. 8 described later, the first portion 6a and the second portion 6b (back-surface electrode) on the front surface 5a side and the back surface 5b side, respectively, of the dielectric element body 5 may separately be formed and may each electrically be connected by a through-hole conductor or a via-hole conductor. Such a configuration of the first portion 6a and the second portion 6b of the first electrode 6 separately formed and electrically connected by a through-hole conductor or a via-hole conductor facilitates accurate arrangement of the electrodes (6, 7) at predetermined positions on the front surface 5a/the back surface 5b of the dielectric element body 5. If the dielectric element body 5 is configured to be thick, the portions may be connected by a pin conductor such as a metal pin in this configuration.

Figure 5:
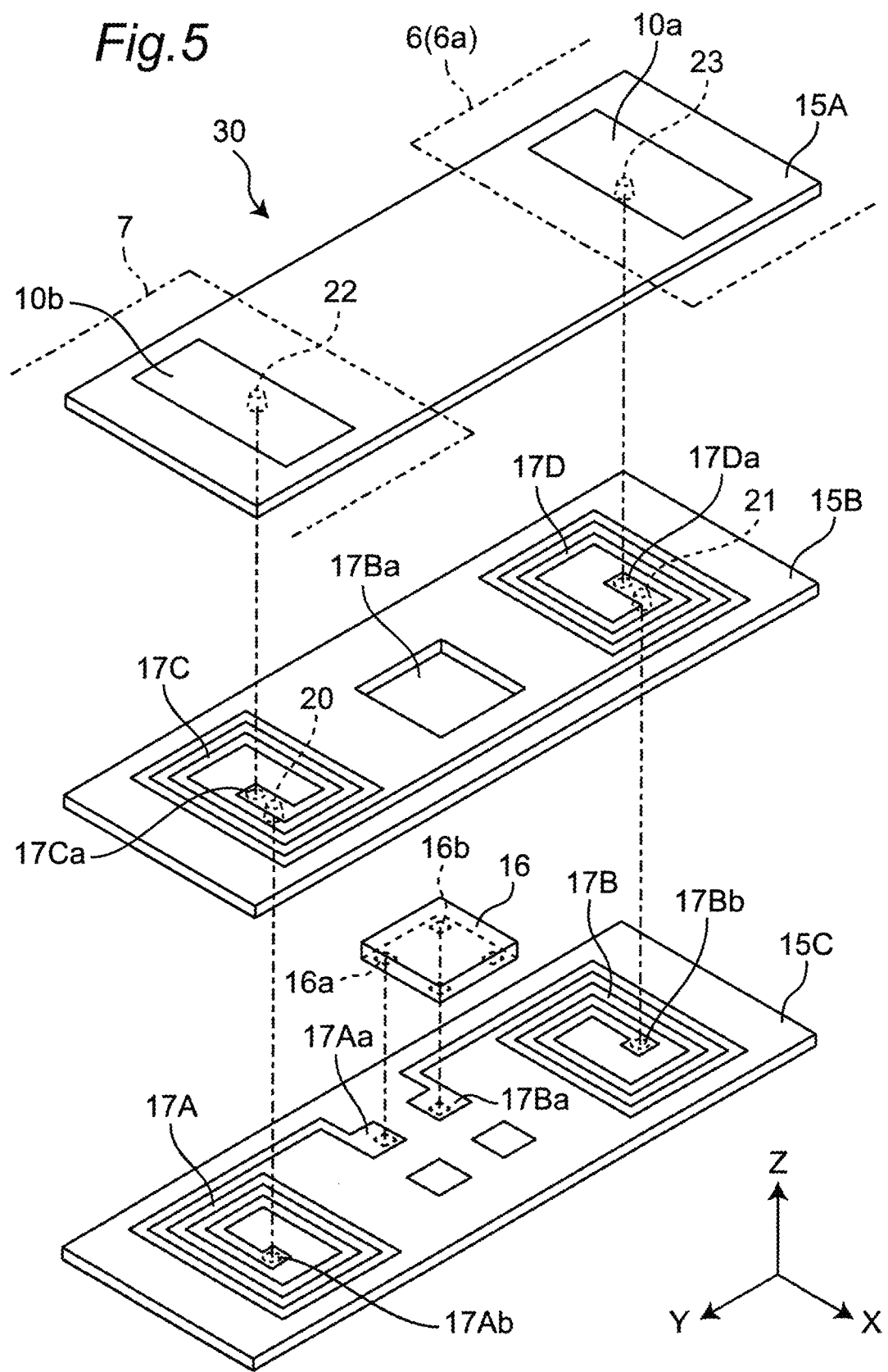
FIG. 5 is an exploded perspective view of an RFIC element in the wireless communication device according to the first exemplary embodiment.

According to the first exemplary embodiment, the RFIC element 10 used in the wireless communication module 2 is a wireless communication device configured to perform wireless communication at a communication frequency of, for example, the 900 MHz band, i.e., the UHF band. The RFIC element 10 will be described with reference to FIG. 5. FIG. 5 is an exploded perspective view of the RFIC element 10.

As shown in FIG. 5, the RFIC element 10 in the first embodiment is made up of a multilayer substrate composed of three layers. Specifically, the RFIC element 10 is formed by laminating flexible insulating sheets 15A, 15B, and 15C made of a resin material such as polyimide and liquid crystal polymer. FIG. 5 shows a disassembled state in which the RFIC element 10 shown in FIG. 3 is turned over.

As shown in FIG. 5, the RFIC element 10 has an RFIC chip 16, a plurality of inductance elements 17A, 17B, 17C, and 17D, and external connection terminals (a first terminal electrode 10a, a second terminal electrode 10b). In the configuration of the first embodiment, the inductance elements 17A to 17D and the external connection terminals (10a, 10b) are formed on rectangular insulating sheets 15A to 15C and are formed of conductor patterns made of a conductive material such as copper.

As shown in FIG. 5, the RFIC chip 16 is mounted on a central part in the longitudinal direction (Y-axis direction) on the insulating sheet 15C. The RFIC chip 16 has a structure in which various elements are incorporated in a semiconductor substrate made of a semiconductor such as silicon. The RFIC chip 16 includes a first input/output terminal 16a and a second input/output terminal 16b. The RFIC chip 16 has an internal capacity (capacitance: a self-capacity of the RFIC chip itself) C1.

As shown in FIG. 5, the inductance element (first inductance element) 17A is made up of a conductor pattern disposed in a spiral coil shape on the insulation sheet 15C on one side in the longitudinal direction (Y-axis direction) of the insulation sheet 15C. The first inductance element 17A includes an inductance L1. A first end (an end on the coil outer side) of the first inductance element 17A is provided with a land 17Aa connected to the first input/output terminal 16a of the RFIC chip 16. A second end (an end on the coil center side) of the first inductance element 17A is provided with a land 17Ab.

As shown in FIG. 5, the inductance element (second inductance element) 17B is made up of a conductor pattern disposed in a spiral coil shape on the insulation sheet 15C on the other side in the longitudinal direction (Y-axis direction) of the insulation sheet 15C. The second inductance element 17B includes an inductance L2. A first end (an end on the coil outer side) of the second inductance element 17B is provided with a land 17Ba connected to the second input/output terminal 16b of the RFIC chip 16. A second end other end (an end on the coil center side) of the second inductance element 17B is provided with a land 17Bb.

As shown in FIG. 5, the inductance element (third inductance element) 17C is made up of a conductor pattern disposed in a spiral coil shape on the insulation sheet 15B on one side in the longitudinal direction (Y-axis direction) of the insulation sheet 15B. The third inductance element 17C is opposite to the first inductance element 17A in the lamination direction (Z-axis direction). The third inductance element 17C includes an inductance L3. A first end (an end on the coil center side) of the third inductance element 17C is provided with a land 17Ca. The land 17Ca is connected to the lands 17Ab of the first inductance element 17A on the insulating sheet 15C via an interlayer connection conductor 20 such as a through-hole conductor penetrating the insulating sheet 15B.

As shown in FIG. 5, the inductance element (fourth inductance element) 17D is made up of a conductor pattern disposed in a spiral coil shape on the insulation sheet 15B on the other side in the longitudinal direction (Y-axis direction) of the insulation sheet 15B. The fourth inductance element 17D is opposite to the second inductance element 17B in the lamination direction (Z-axis direction). The fourth inductance element 17D includes an inductance L4. A first end (an end on the coil center side) of the fourth inductance element 17D is provided with a land 17Da. The land 17Da is connected to the lands 17Bb of the second inductance element 17B on the insulating sheet 15C via an interlayer connection conductor 21 such as a through-hole conductor penetrating the insulating sheet 15B.

The inductance elements 17C, 17D on the insulating sheet 15B are integrated as one conductor pattern. Specifically, the respective other second ends (ends on the coil outer side) are connected to each other. The insulating sheet 15B is provided with a through-hole 15Ba in which the RFIC chip 16 mounted on the insulating sheet 15C is received.

As shown in FIG. 5, the external connection terminals (10a, 10b) of the RFIC element 10 are made up of conductor patterns disposed on the insulating sheet 15A. The external connection terminals (10a, 10b) are opposite in the longitudinal direction (Y-axis direction) of the insulating sheet 15A.

The second terminal electrode 10b is one external connection terminal and is connected to the land 17Ca of the third inductance element 17C on the insulating sheet 15B via an interlayer connection conductor 22 such as a through-hole conductor penetrating the insulating sheet 15A.

The first terminal electrode 10a is the other external connection terminal and is connected to the land 17Da of the fourth inductance element 17D on the insulating sheet 15B via an interlayer connection conductor 23 such as a through-hole conductor penetrating the insulating sheet 15A.

The first terminal electrode 10a is connected via, for example, solder to the first portion 6a of the first electrode 6 formed on the front surface 5a side of the dielectric element body 5. Similarly, the second terminal electrode 10b is connected via, for example, solder to the second electrode 7 formed on the front surface 5a side of the dielectric element body 5.

The RFIC chip 16 is made up of a semiconductor substrate. The RFIC chip 16 is disposed between the first inductance element 17A and the second inductance element 17B as well as between the third inductance element 17C and the fourth inductance element 17D, and the RFIC chip 16 functions as a shield. Since the RFIC chip 16 functions as a shield, magnetic-field coupling and capacitive coupling are suppressed between the first inductance element 17A and the second inductance element 17B having the spiral coil shape disposed on the insulating sheet 15C. Similarly, magnetic-field coupling and capacitive coupling are suppressed between the third inductance element 17C and the fourth inductance element 17D having the spiral coil shape disposed on the insulating sheet 15B. As a result, a passband of communication signals is prevented from narrowing.

Figure 6:
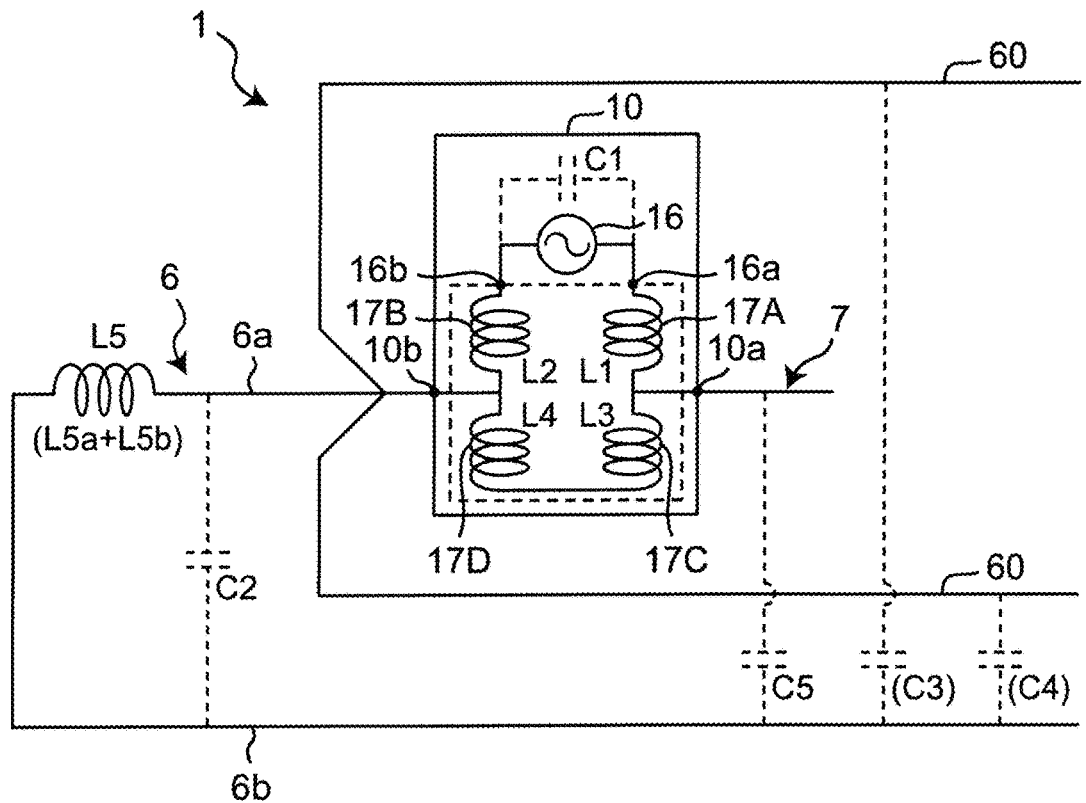
FIG. 6 is an equivalent circuit diagram of the wireless communication device of the first exemplary embodiment.

FIG. 6 shows an equivalent circuit of the wireless communication device 1 of the first embodiment. As shown in FIG. 6, between the first portion 6a and the second portion 6b (back-surface electrode) facing each other in the first electrode 6, a distributed capacity C2 exists between the opposite electrodes. The distributed capacity C2 between the first portion 6a and the second portion 6b (back-surface electrode) includes stray capacities C3, C4 between the second portion 6b (back-surface electrode) and the two extended parts 60, 60 extending to an edge portion of the dielectric element body 5 in the longitudinal direction (Y-axis direction). An inductance L5 indicates a parasitic inductance of the first electrode 6. More specifically, an inductance L5a before connection to the RFIC element 10 and a parasitic inductance L5b of the extended part 60 are included. In the wireless communication device 1 of the first embodiment, the distributed capacity C2 and the parasitic inductance L5 constitute a predetermined parallel resonance circuit (e.g., 900 MHz). Since an electric field of a resonance frequency is radiated from the first portion 6a of the first electrode 6 at this resonance frequency, the device operates as an electric field antenna. On the other hand, a magnetic field of a resonance frequency is generated between the first portion 6a and the second portion 6b (back-surface electrode) constituting the parallel resonance. The axis of this magnetic field is the Z axis of the wireless communication module 2, and therefore, when the wireless communication module 2 is affixed to a metal surface 70a of an article 70, the metal surface 70a can be operated as a radiation plate. As a result, the wireless communication module 2 can operate alone as a wireless communication device and can be attached to the metal surface 70a of the article 70 to operate as a wireless communication device further improving the reading distance.

Additionally, between facing portions of the second electrode 7 and the second portion 6b (back-surface electrode), an electrostatic capacity C5 exists between the facing electrode 7 and the second portion 6b electrode. A circuit formed by the inductance L5a before connection to the RFIC element 10 and the electrostatic capacity C5 and the RFIC element 10 is electrically connected to the parallel resonance circuit formed by the distributed capacity C2 and the inductance L5 described above.

In the RFIC element 10, as shown in FIG. 6, a matching circuit for matching between the RFIC chip 16 and an antenna pattern (the first electrode 6 and the second electrode 7) is made up of the capacity C1 that is the internal capacity of the RFIC chip 16 and the inductances L1 to L4 (inductances of the four inductance elements). Since the pattern of the RFIC element 10 is an air core coil, a leakage magnetic field is generated near the element. Since the RFIC element 10 is on the upper side of the first portion 6a in the Z direction, this leakage magnetic field generates a current flowing through the first portion 6a and interferes with an electric field radiated from the first portion 6a. Since the electric field radiation of the first portion 6a is most strongly radiated from a longitudinal edge end portion of the extended part 60, the RFIC element 10 is preferably disposed at a position other than the longitudinal edge end portion of the first portion 6a. Additionally, to avoid propagation of the magnetic field generated by the RFIC element 10 as an antenna, the first portion 6a is preferably disposed as a pattern surrounding the second electrode 7.

In the configuration of the wireless communication device 1 of the first embodiment, the stray capacity C5 of the facing portions between the second electrode 7 and the second portion 6b (back-surface electrode) is set smaller than the stray capacity C2 in the facing portions between the first portion 6a and the second portion 6b (back-surface electrode). The stray capacity C5 is also set smaller than the stray capacities C3, C4 of the facing portions between the extended part 60 of the first portion 6a and the second portion 6b (back-surface electrode).

Figure 7:
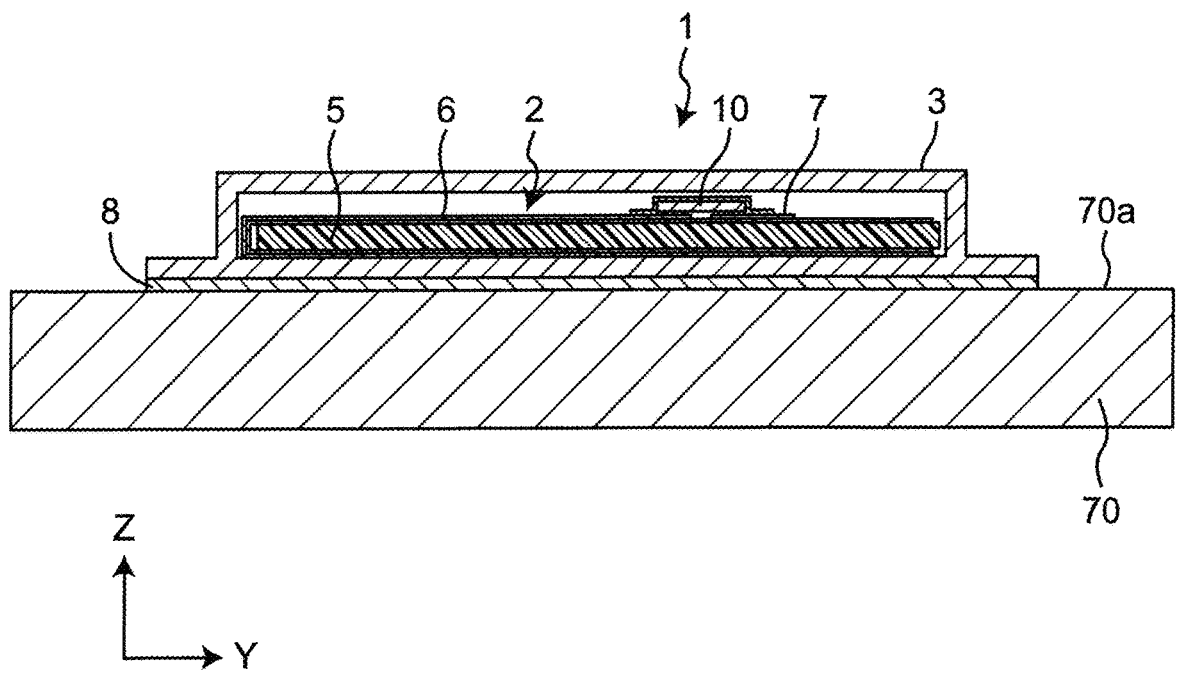
FIG. 7 is a cross-sectional view showing a state of the wireless communication device of the first exemplary embodiment affixed to an article.

As described above, the wireless communication device 1 of the first embodiment is configured to be affixed to the metal surface 70a of the article 70 in use. FIG. 7 is a cross-sectional view showing a state of the wireless communication device 1 of the first embodiment affixed to the metal surface 70a of the article 70. As shown in FIG. 7, the protective case 3 housing the wireless communication module 2 is affixed to the metal surface 70a of the article 70 via an adhesive layer 8. Therefore, the metal surface 70a of the article 70 having the wireless communication device 1 affixed thereto and the second portion 6b (back-surface electrode) of the first electrode 6 in the wireless communication device 1 are in a capacitively coupled state. While the wireless communication device 1 is affixed to the metal surface 70a of the article 70 in this way, the wireless communication device 1 is configured to use the metal surface 70a as an antenna and perform wireless communication with high radiation efficiency to enable long distance communication.

Figure 8:
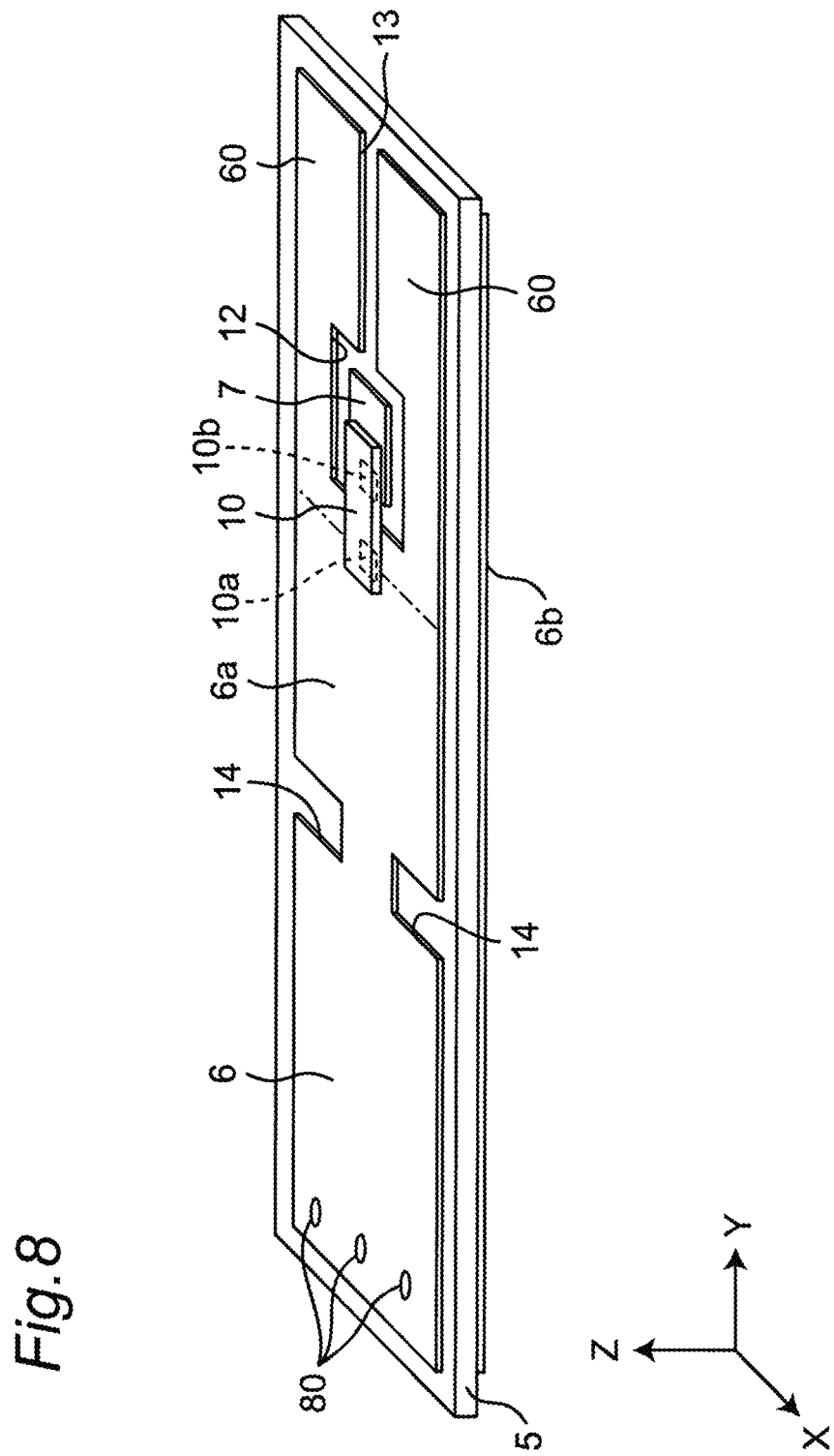
FIG. 8 is a perspective view showing a modification of the wireless communication module in the wireless communication device of the first exemplary embodiment.

FIG. 8 is a perspective view showing a modification of the wireless communication module 2 in the wireless communication device 1 of the first embodiment. The modification of the wireless communication module 2 shown in FIG. 8 has a configuration of the first electrode 6 different from the configuration shown in FIG. 2. As shown in FIG. 8, the first portion 6a and the second portion 6b (back-surface electrode) of the first electrode 6 are separately formed. In this configuration, the first portion 6a and the second portion 6b are electrically connected by a connection conductor 80, for example, a through-hole conductor or a via-hole conductor. As described above, instead of forming the first electrode 6 as one metal film, the first portion 6a and the second portion 6b are separately formed and electrically connected by a through-hole conductor or a via hole conductor etc. in this configuration. If the dielectric element body 5 is configured to be thick, the portions may be connected by a metal pin in this configuration. In the wireless communication module 2 configured as described above, the first electrode 6 and the second electrode 7 can be arranged at predetermined positions with high accuracy on the front surface 5a/the back surface 5b of the dielectric element body 5. The wireless communication device of the first embodiment can be processed by repeatedly imposing metal-compatible RFID inlays on the flat plate-shaped element body 5 having a constant thickness. Additionally, a display label and the sticking member 4 can be affixed to the inlays in a repeatedly imposed manner. Therefore, the wireless communication device 1 of the second embodiment has a configuration enabling mass-production of metal-compatible RFID tags. Additionally, since the RFID tags can be configured to have a small thickness of, for example, 1 mm or less (furthermore, 0.6 mm or less), encoding and displaying/printing can be performed by a general RFID label printer, which facilitates the encoding of metal-compatible tags.

The modification of the wireless communication module 2 shown in FIG. 8 is provided with cutout parts 14 recessed inward on both sides parallel to the longitudinal direction (Y-axis direction) in the first portion 6a of the first electrode 6. In the configuration of this modification, the resonance frequency in the wireless communication module 2 can be changed by forming the cutout parts 14 on both sides of the first portion 6a of the first electrode 6. In the wireless communication module 2 shown in FIG. 8 configured as described above, the resonance frequency can be set to a desired frequency without changing the outer shape dimension of the wireless communication module 2.

Second Embodiment

The wireless communication device 1 (RFID tag) of the second exemplary embodiment will hereinafter be described. The wireless communication device 1 of the second embodiment is also configured to perform wireless communication through a high frequency signal having a UHF-band communication frequency (carrier frequency) and is configured to enable wireless communication in a wide frequency band. The wireless communication device 1 of the second embodiment is different from the configuration of the first embodiment described above in configuration of a first electrode 6A and a second electrode 7A in a wireless communication module 2A, and the other configurations are the same as the configuration of the wireless communication module 2 in the first embodiment. Therefore, in the description of the wireless communication device 1 of the second embodiment, the first electrode 6A and the second electrode 7A of the wireless communication module 2A in the second embodiment will mainly be described. In the description of the second embodiment, the elements having the same configurations, operations, and functions as the first embodiment described above are denoted by the same reference numerals and will not be described to avoid redundant description in some cases.

Figure 9:
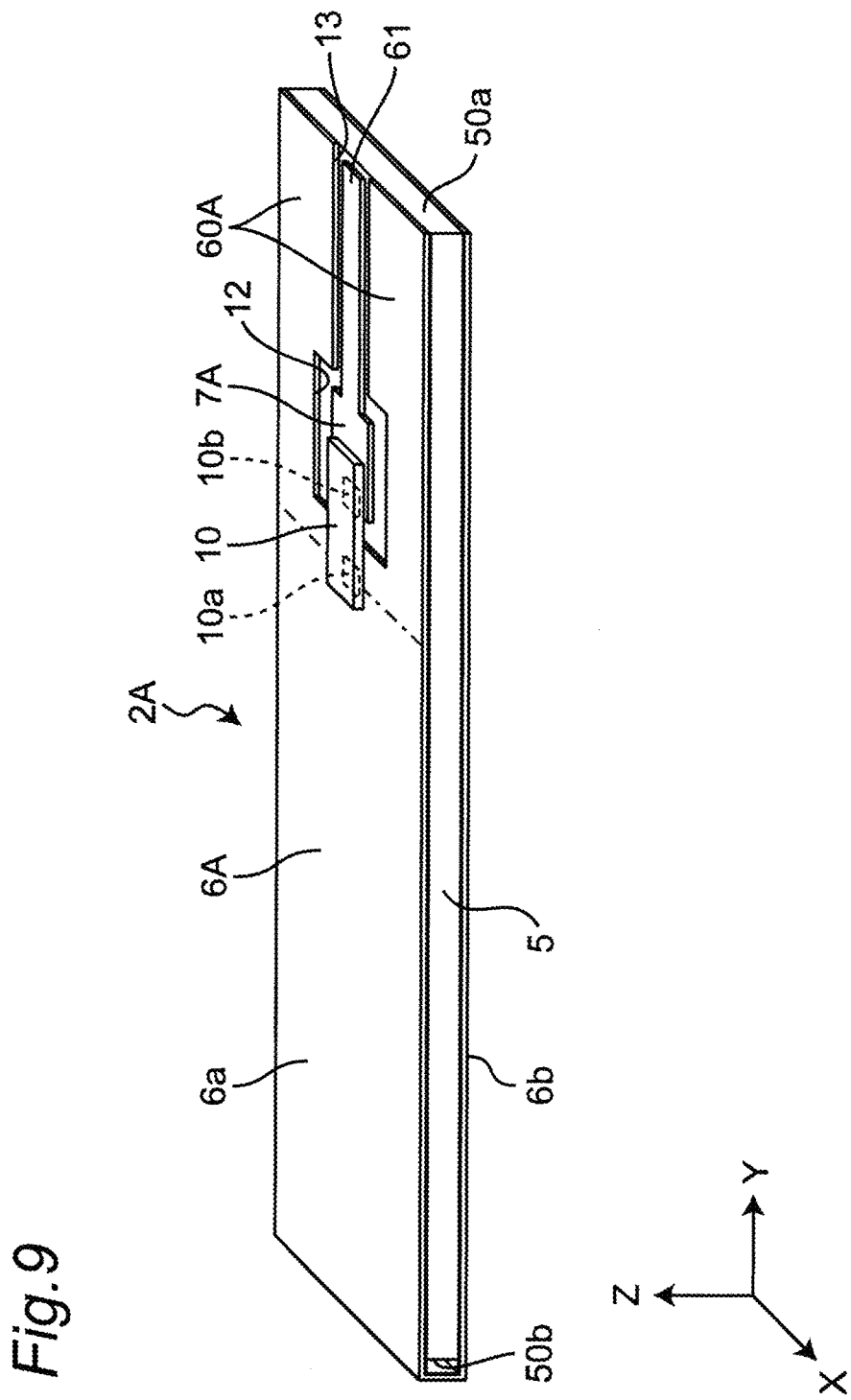
FIG. 9 is a perspective view showing a configuration of a wireless communication module in a wireless communication device of a second exemplary embodiment.

FIG. 9 is a perspective view showing a configuration of the wireless communication module 2A in the wireless communication device 1 of the second embodiment. As with the wireless communication module 2 of the first embodiment, the wireless communication module 2A in the second embodiment has the dielectric element body 5, the first electrode 6A and the second electrode 7A disposed on the dielectric element body 5, and the RFIC element 10 connected to the first electrode 6A and the second electrode 7A. The first electrode 6A is formed on both the front and back surface sides of the dielectric element body 5, and the second electrode 7A is formed on the front surface 5a side of the dielectric element body 5.

As shown, the first electrode 6A has the first portion 6a formed on the front surface 5a side of the dielectric element body 5 and the second portion 6b formed on the back surface 5b side as a back-surface electrode. The second portion 6b (i.e., a back-surface electrode) of the first electrode 6A is formed substantially entirely over the back surface 5b of the dielectric element body 5. Therefore, the second portion (i.e., a back-surface electrode) 6b of the first electrode 6A is arranged to face the first portion 6a of the first electrode 6A and the second electrode 7 via the dielectric element body 5. The first portion 6a and the second portion 6b of the first electrode 6 are made up of one metal film.

As shown in FIG. 9, in the wireless communication module 2A in the second embodiment, the second electrode 7A disposed inside the opening 12 of the first electrode 6A is configured to have a projecting part 61 disposed inside the cutout part 13. The projecting part 61 of the second electrode 7A is formed for leading-out to the vicinity of the outer edge of the first end 50a (shown as the right end in FIG. 9) in the longitudinal direction (i.e., Y-axis direction) in the dielectric element body 5 as with the extended part 60 in the first electrode 6A. A predetermined interval exists between the inner edge of the opening 12 and the outer edge of the second electrode 7A facing thereto. A gap between each of both side edges extending in the projecting direction of the projecting part 61 of the second electrode 7A and the inner edge of the cutout part 13 is set to a predetermined interval.

As shown in FIG. 9, although the opening 12 and the cutout part 13 for disposing the second electrode 7A are formed in an extended part 60A in the wireless communication module 2A in the second embodiment, the facing area of the extended part 60A with respect to the second portion 6b serving as the back-surface electrode is made larger than the facing area of the second electrode 7A with respect to the second portion 6b. In the configuration of the second embodiment, the extended part 60A is formed to largely extend from both sides of the arrangement position of the second electrode 7A toward the first end 50a side (shown as the right end side in FIG. 9). Therefore, the extended part 60A is formed to extend toward the first end 50a side to surround both sides of the second electrode 7A and has the first end 50a side-portion divided into two by the opening 12 and the cutout part 13. In each of these two divided extended parts 60, the facing area with respect to the second portion 6b is made larger than the facing area of the second electrode 7A with respect to the second portion 6b.

The wireless communication module 2A in the second embodiment configured as described above is housed in the protective case 3 to serve as the wireless communication device 1 as described in the first embodiment. The wireless communication device 1 of the second embodiment is affixed to the metal surface 70a of the article 70 and can use the metal surface 70a as an antenna and thereby perform wireless communication with high radiation efficiency to enable long distance communication.

Third Embodiment

The wireless communication device 1 (RFID tag) of a third exemplary embodiment will hereinafter be described. The wireless communication device 1 of the third embodiment is also configured to perform wireless communication through a high frequency signal having a UHF-band communication frequency (carrier frequency) and is configured to enable wireless communication in a wide frequency band. The wireless communication device 1 of the third embodiment is different from the wireless communication device 1 of the first embodiment described above in configuration of a first electrode 6B and a second electrode 7B in a wireless communication module 2B, and the other configurations are the same as the wireless communication module 2 in the first embodiment. Therefore, in the description of the wireless communication device 1 of the third embodiment, the first electrode 6B and the second electrode 7B of the wireless communication module 2B will mainly be described. In the description of the third embodiment, the elements having the same configurations, operations, and functions as the first and second embodiments described above are denoted by the same reference numerals and will not be described to avoid redundant description in some cases.

Figure 10:
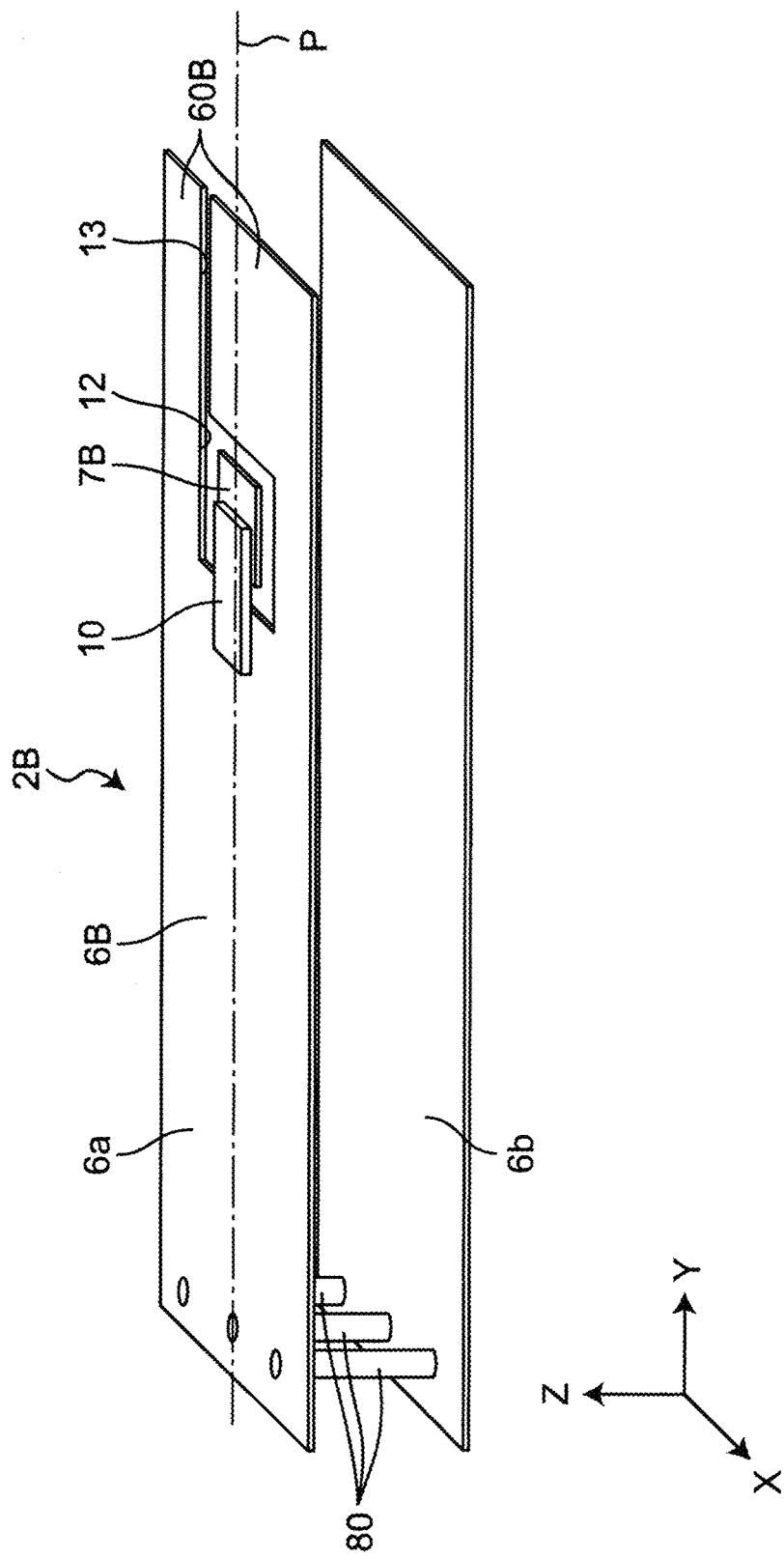
FIG. 10 is a perspective view showing an electrode structure of a wireless communication module in a wireless communication device of a third exemplary embodiment.
Figure 11:
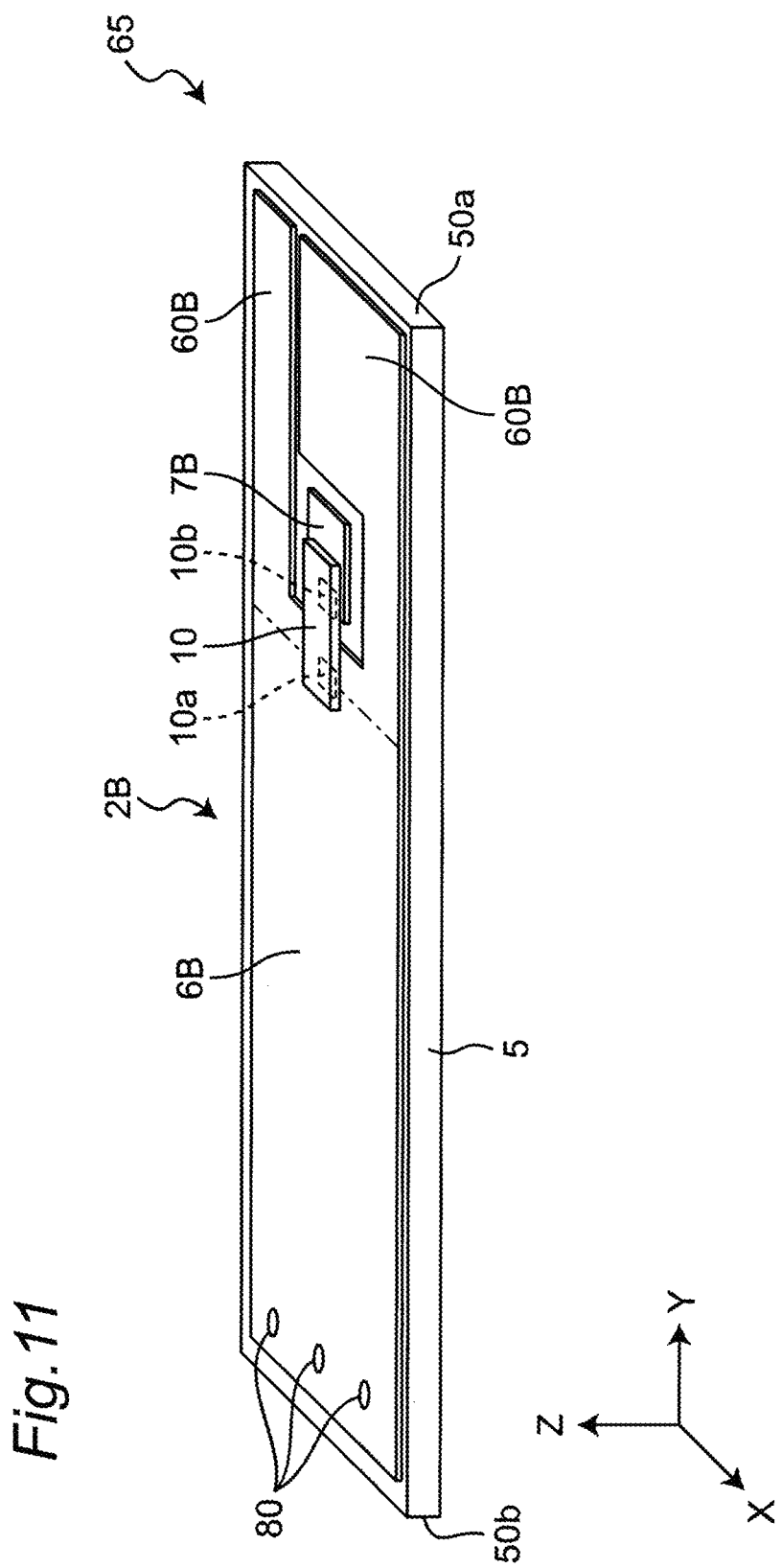
FIG. 11 is a perspective view showing a configuration of the wireless communication module in the third exemplary embodiment.

FIG. 10 is a perspective view showing a structure of the first electrode 6B and the second electrode 7B of the wireless communication module 2B in the wireless communication device 1 of the third embodiment. FIG. 11 is a perspective view showing a configuration of the wireless communication module 2B in the third embodiment. As with the wireless communication module 2 of the first embodiment, the wireless communication module 2B in the third embodiment has the rectangular dielectric element body 5, the first electrode 6B and the second electrode 7B disposed on the dielectric element body 5, and the surface-mounted RFIC element 10 connected to the first electrode 6B and the second electrode 7B. The first electrode 6B is formed on both the front and back surface sides of the dielectric element body 5, and the second electrode 7B is formed on the front surface 5a side of the dielectric element body 5.

In the configuration of the wireless communication device 1 of the third embodiment, as shown in FIG. 10, the first portion 6a and the second portion 6b (i.e., a back-surface electrode) of the first electrode 6B are separately formed and arranged on both the front and back sides of the dielectric element body 5. For the dielectric element body 5 used in this case, in addition to the dielectric material described in the first embodiment, for example, a glass-epoxy substrate (FR-4) with high insulation, fire retardance, and flame resistance may be used. In this configuration, the first portion 6a on the front-surface side and the second portion 6b on the back-surface side are electrically connected by the connection conductor 80, for example, a through-hole conductor or a via-hole conductor. The configuration electrically connected by a via-hole conductor is a configuration suitable for mass production. If the dielectric element body 5 is configured to be thick, the portions may be connected by a metal pin in this configuration. In the wireless communication module 2B configured as described above, the first electrode 6B and the second electrode 7B can be arranged at predetermined positions with high accuracy on the front surface 5a/the back surface 5b of the dielectric element body 5.

In the wireless communication device 1 of the third embodiment, as shown in FIGS. 10 and 11, the second electrode 7B is disposed inside the opening 12 of the first electrode 6B, and the cutout part 13 is formed to extend from this opening 12 to an outer edge of an extended part 60B of the first electrode 6B. In the wireless communication device 1 of the third embodiment, the cutout part 13 has an extending direction parallel to a center line P extending in the longitudinal direction (Y-axis direction) of the first electrode 6B and is formed at a position offset from the center line P.

In the wireless communication device 1 of the third embodiment, the extended part 60B of the first portion 6a disposed on the front surface 5a side of the dielectric element body 5 extends from a position of connection of the first terminal electrode 10a of the external connection terminal of the RFIC element 10 toward the first end 50a side (shown as the right end side in FIG. 11) in the Y-axis direction of the dielectric element body 5 and is formed to a position near the outer edge of the first end 50a of the dielectric element body 5. As shown in FIG. 10, although the opening 12 and the cutout part 13 are formed in the extended part 60B, the facing area of the extended part 60B with respect to the second portion 6b serving as the back-surface electrode is made larger than the facing area of the second electrode 7B with respect to the second portion 6b. In the configuration of the third embodiment, the extended part 60B is formed to extend toward the first end 50a side (shown as the right end side in FIG. 10) at a position eccentric from both sides of the arrangement position of the second electrode 7B (i.e., at a position offset from the center line P). Therefore, the extended part 60B is formed to extend to the first end 50a side to surround both sides of the second electrode 7B and has the first end 50a side-portion divided into two by the opening 12 and the cutout part 13. In each of these two divided extended parts 60B, the facing area with respect to the second portion 6b (i.e., a back-surface electrode) is made larger than the facing area of the second electrode 7B with respect to the second portion 6b.

In the configuration of the third embodiment, the length in the X-axis direction (i.e., the width direction) of the first portion 6a is made substantially equal to the sum of the lengths in the X-axis direction (i.e., the width direction) of the two divided regions on the first end 50a side (shown as the right end side in FIG. 10) of the extended part 60B. Therefore, the first portion 6a of the first electrode 6B is configured to be capacitively coupled through the dielectric element body 5 substantially wholly uniformly to the second portion 6b (i.e., a back-surface electrode).

Figure 12:
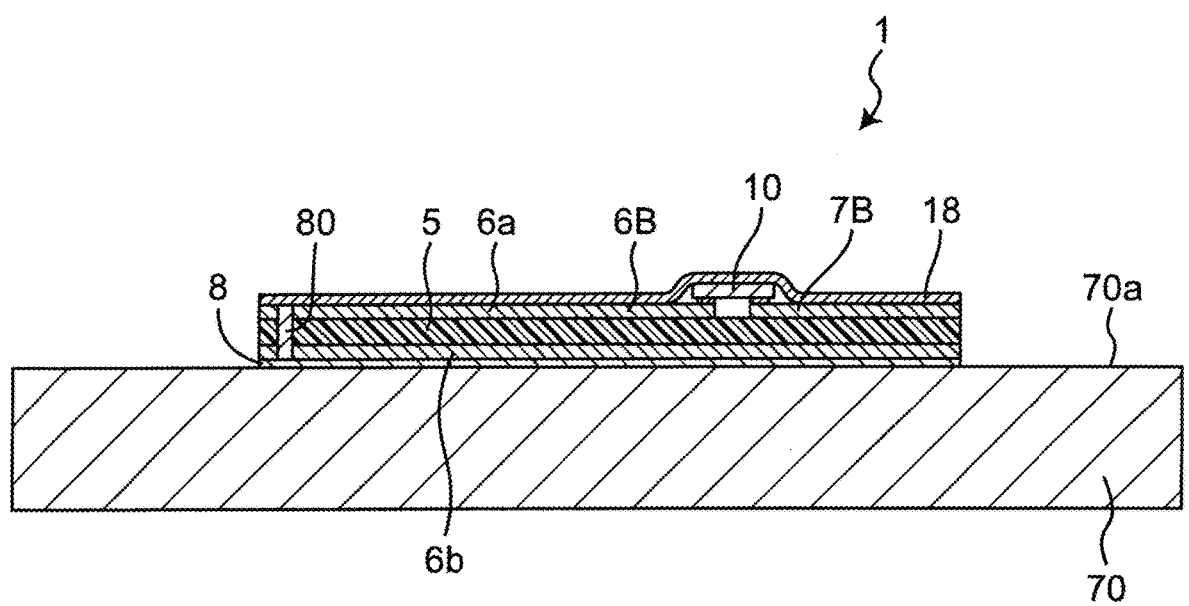
FIG. 12 is a cross-sectional view showing a state of the wireless communication device of the third exemplary embodiment affixed to an article.

FIG. 12 is a cross-sectional view showing a state of the wireless communication device 1 of the third embodiment affixed to the metal surface 70a of the article 70. As shown in FIG. 12, in the configuration of the wireless communication device 1 of the third embodiment, the wireless communication module 2B is not housed in a protective case, and the wireless communication module 2B is directly connected to the metal surface 70a of the article 70 via the adhesive layer 8. The wireless communication device 1 of the third embodiment has a display label 18 affixed to the front surface side of the wireless communication module 2B. An adhesive layer is formed on a back surface of the display label 18, and the display label 18 is affixed to the RFIC element 10, the first portion 6a of the first electrode 6B, and the second electrode 7B to cover the entire front surface 5a side of the dielectric element body 5. The front surface of the display label 18 is configured such that information on the article can be printed and displayed, for example.

Since the wireless communication device 1 of the third embodiment configured as described above is configured without using a protective case and has a configuration in which the wireless communication module 2B is protected by the display label 18, the wireless communication device 1 can be formed into an RFID tag having a thin membrane shape, for example, a thin film shape with a thickness of 1 mm or less (furthermore, 0.6 mm or less).

As described above, the wireless communication device 1 of the third embodiment can be made up of a thin film-shaped RFID tag, and therefore, a display label can be affixed to repeatedly imposed metal-compatible RFID tag inlays. Therefore, the wireless communication device 1 of the third embodiment has a configuration enabling mass-production of metal-compatible RFID tags. Additionally, since the RFID tags can be configured to have a small thickness of, for example, 0.6 mm or less, encoding and displaying/printing can be performed by an RFID label printer.

The wireless communication device 1 of the third embodiment can use the metal surface 70a of the article 70 as an antenna with a simple configuration and perform wireless communication with high radiation efficiency to enable long distance communication and is configured such that a displaying/printing operation can easily be performed for each of metal-compatible RFID tags, resulting in a mass-producible configuration.

Fourth Embodiment

The wireless communication device 1 (RFID tag) of a fourth exemplary embodiment will hereinafter be described. The wireless communication device 1 of the fourth embodiment is also configured to perform wireless communication through a high frequency signal having a UHF-band communication frequency (carrier frequency) and is configured to enable wireless communication in a wide frequency band. The wireless communication device 1 of the fourth embodiment is different from the wireless communication device 1 of the first embodiment described above in configuration of a first electrode 6C and a second electrode 7C in a wireless communication module 2C, and the other configurations are the same as the wireless communication module 2 in the first embodiment. Therefore, in the description of the wireless communication device 1 of the fourth embodiment, the first electrode 6C and the second electrode 7C of the wireless communication module 2C will mainly be described. In the description of the fourth embodiment, the elements having the same configurations, operations, and functions as the first to third embodiments described above are denoted by the same reference numerals and will not be described to avoid redundant description in some cases.

Figure 13:
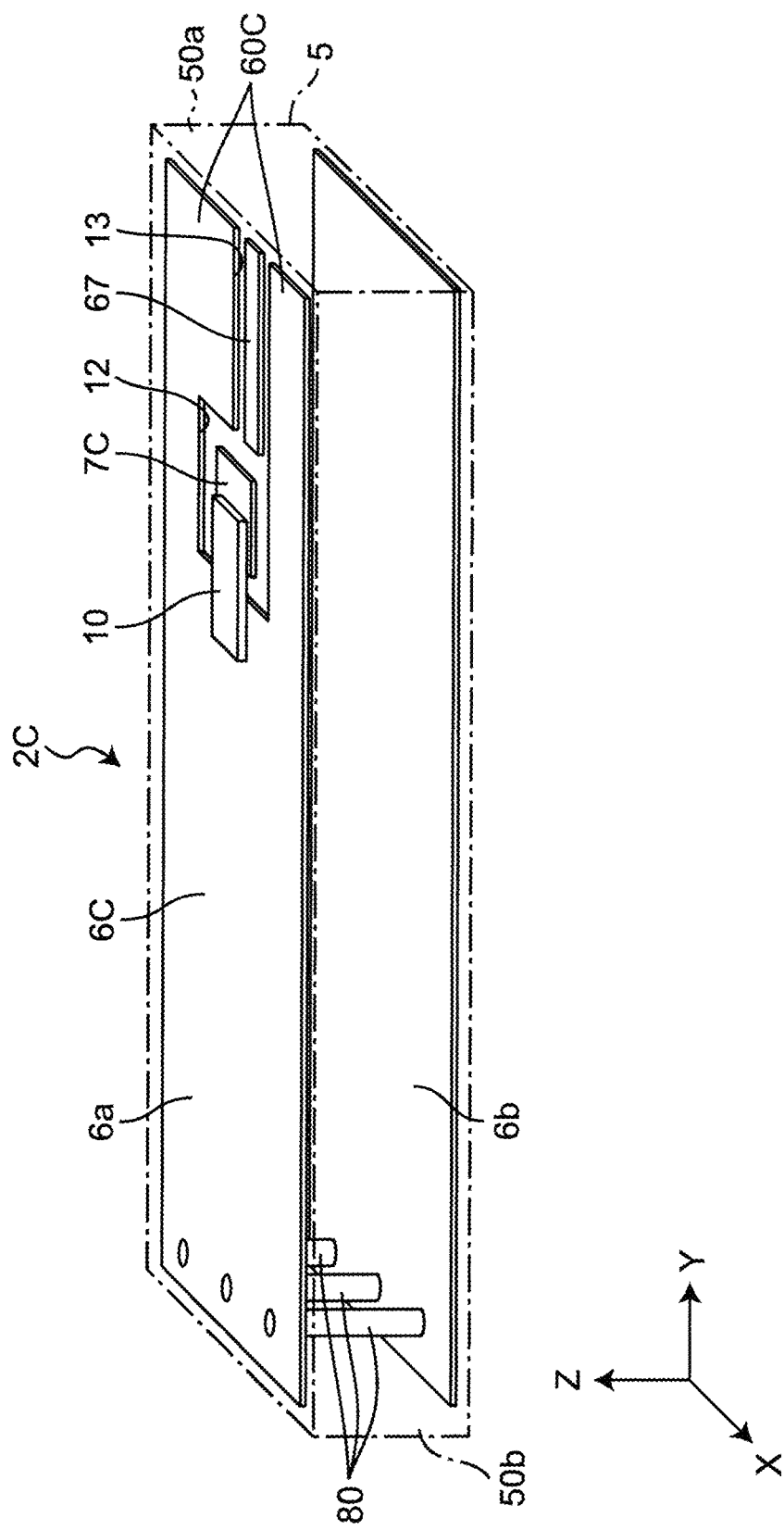
FIG. 13 is a perspective view showing an electrode structure of a wireless communication module in a wireless communication device of a fourth exemplary embodiment.

FIG. 13 is a perspective view showing a structure of the first electrode 6C and the second electrode 7C of the wireless communication module 2C in the wireless communication device 1 of the fourth embodiment. As with the wireless communication module 2 of the first embodiment, the wireless communication module 2C in the fourth embodiment has the rectangular dielectric element body 5, the first electrode 6C and the second electrode 7C disposed on the dielectric element body 5, and the surface-mounted RFIC element 10 connected to the first electrode 6C and the second electrode 7C. The first electrode 6C is formed on both the front and back surface sides of the dielectric element body 5, and the second electrode 7C is formed on the front surface 5a side of the dielectric element body 5.

In the wireless communication device 1 of the fourth embodiment, as shown in FIG. 13, the first portion 6a and the second portion 6b (i.e., a back-surface electrode) of the first electrode 6C are separately formed. In this configuration, the first portion 6a on the front-surface side and the second portion 6b on the back-surface side are electrically connected by the connection conductor 80, for example, a through-hole conductor or a via-hole conductor. If the dielectric element body 5 is configured to be thick, for example, has a configuration using a glass-epoxy substrate (FR-4) etc., the portions may be connected by a metal pin in this configuration. The wireless communication module 2C configured in this manner is configured such that the first electrode 6C and the second electrode 7C can be disposed at predetermined positions with high accuracy on the front surface 5a and the back surface 5b of the dielectric element body 5.

In the wireless communication device 1 of the fourth embodiment, the opening 12 is formed in the first portion 6a on the front surface side of the first electrode 6C as in the configurations of the first to third embodiments described above, and the second electrode 7C is disposed inside the opening 12. The cutout part 13 is formed to extend from the opening 12 to an outer edge (left end in FIG. 13) of an extended part 60C in the first portion 6a in the extending direction (i.e., the Y-axis direction). Therefore, the cutout part 13 linking the inner edge of the opening 12 and the outer edge of the extended part 60C is formed. The wireless communication device 1 of the fourth embodiment has a floating electrode 67 disposed in a region inside the cutout part 13. This floating electrode 67 has an elongated shape extending in the same direction as the extending direction of the cutout part 13 and has the same length as the length of the cutout parts 13 in the extending direction. Therefore, the floating electrode 67 has a predetermined distance from the inner edge of the cutout part 13 and is extended along the inner edge. The floating electrode 67 is arranged separately from the second electrode 7C and is disposed in a so-called floating state inside the cutout part 13. The floating electrode 67 is disposed facing the second portion 6b (i.e., a back-surface electrode) of the first electrode 6C via the insulating element body 5 and is capacitively coupled thereto.

In the wireless communication device 1 of the fourth embodiment, the extended part 60C of the first portion 6a extends from a position of connection of the first terminal electrode 10a of the external connection terminal of the RFIC element 10 toward the first end 50a side (shown as the right end side in FIG. 13) in the Y-axis direction of the dielectric element body 5 and is formed to near the outer edge of the first end 50a of the dielectric element body 5. As shown in FIG. 13, although the opening 12, the cutout part 13, and the floating electrode 67 are formed in the extended part 60C, the facing area of the extended part 60B with respect to the second portion 6b serving as the back-surface electrode is made larger than the facing area of the second electrode 7C with respect to the second portion 6b.

In the configuration of the fourth embodiment, the extended part 60C is formed to largely extend from the formation position of the second electrode 7C toward the first end 50a side (shown as the right end side in FIG. 11). Therefore, the extended part 60C is formed to extend toward the first end 50a side to surround both sides of the second electrode 7C and has the first end 50a side-portion divided into two by the opening 12 and the cutout part 13. In each of these two divided extended parts 60C, the facing area with respect to the second portion 6b is made larger than the facing area of the second electrode 7 with respect to the second portion 6b. Therefore, the first portion 6a of the first electrode 6C is configured to be capacitively coupled through the dielectric element body 5 substantially wholly uniformly to the second portion 6b (i.e., a back-surface electrode).

The wireless communication module 2C in the fourth embodiment configured as described above can have a configuration housed in the protective case 3 as described in the first embodiment or a configuration with the display label 18 affixed as described in the third embodiment. Therefore, the wireless communication module 2C in the fourth embodiment produces the same effects as the first to third embodiments and can be affixed to the metal surface 70a of the article 70 to use the metal surface 70a as a radiation plate or a booster antenna, thereby performing wireless communication with high radiation efficiency to enable long distance communication.

Fifth Embodiment

The wireless communication device 1 (RFID tag) of a fifth exemplary embodiment will hereinafter be described. The wireless communication device 1 of the fifth embodiment is also configured to perform wireless communication through a high frequency signal having a UHF-band communication frequency (carrier frequency) and is configured to enable wireless communication in a wide frequency band. The wireless communication device 1 of the fifth embodiment is different from the wireless communication device 1 of the first embodiment described above in configuration of a first electrode 6D in a wireless communication module 2D, and the other configurations are the same as the wireless communication module 2 in the first embodiment. Therefore, in the description of the wireless communication device 1 of the fifth embodiment, the first electrode 6D of the wireless communication module 2C will mainly be described. In the description of the fifth embodiment, the elements having the same configurations, operations, and functions as the first to fourth embodiments described above are denoted by the same reference numerals and will not be described to avoid redundant description in some cases.

Figure 14:
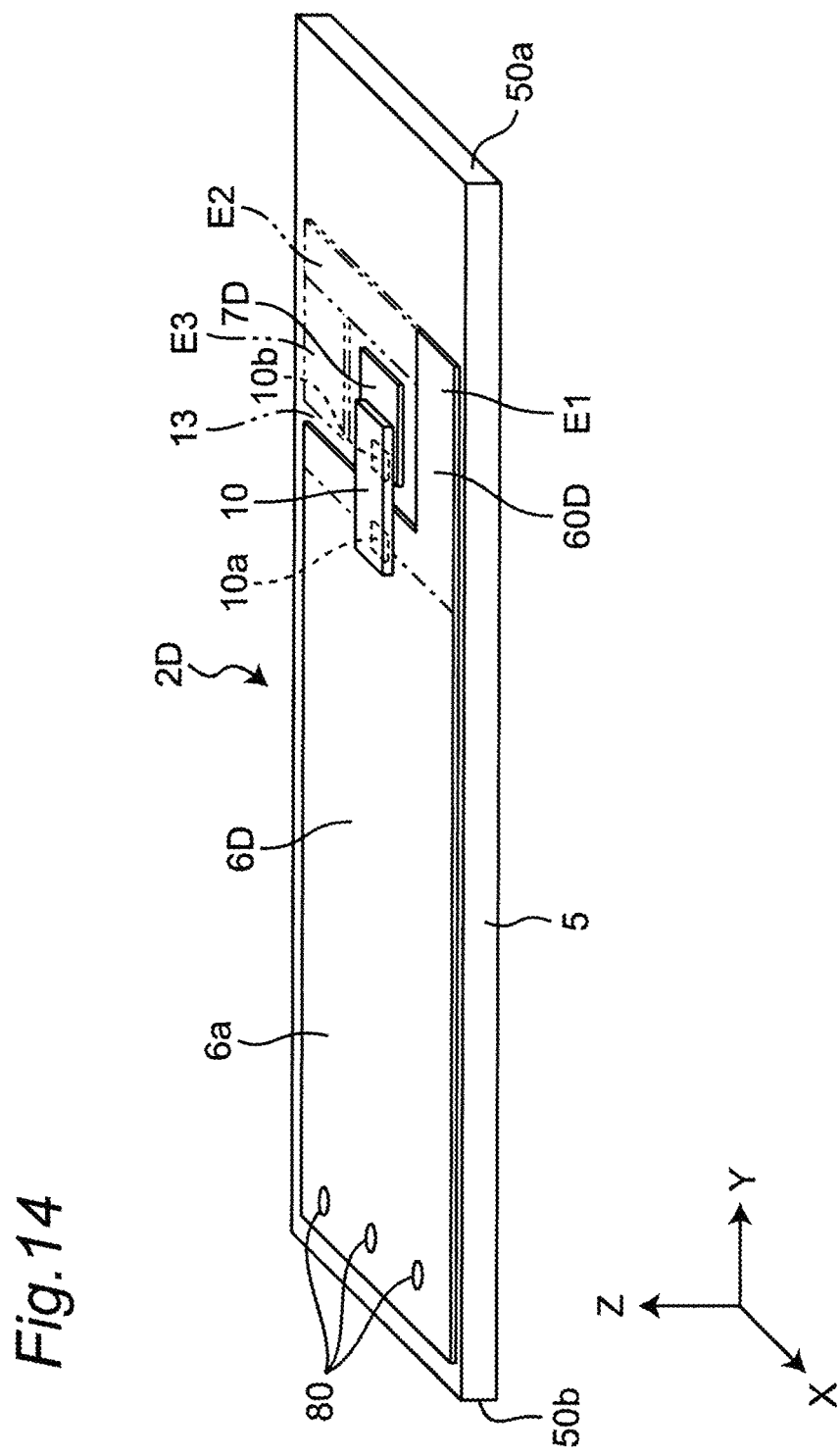
FIG. 14 is a perspective view showing an electrode structure of a wireless communication module in a wireless communication device of a fifth exemplary embodiment.

FIG. 14 is a perspective view showing arrangement positions of the first portion 6a of the first electrode 6D and the second electrode 7D on the front surface side of the wireless communication module 2D in the wireless communication device 1 of the fifth embodiment. As with the wireless communication module 2 of the first embodiment, the wireless communication module 2D in the fifth embodiment has the rectangular dielectric element body 5, the first electrode 6D and the second electrode 7D disposed on the dielectric element body 5, and the surface-mounted RFIC element 10 connected to the first electrode 6D and the second electrode 7D. The first electrode 6D is formed on both the front and back surface sides of the dielectric element body 5, and the second electrode 7D is formed on the front surface 5a side of the dielectric element body 5.

As with the other embodiments, the second portion serving as the back-surface electrode is formed on the back-surface side of the wireless communication module 2D in the fifth embodiment at least at a position facing the first portion 6a and the second electrode 7D. The second portion (6b) serving as the back-surface electrode may be disposed on the entire back surface side of the wireless communication module 2D.

As shown in FIG. 14, the first portion 6a of the first electrode 6D on the front surface side of the wireless communication module 2D has an extended part 60D extending along the longitudinal direction (i.e., an Y-axis direction) beyond the connection position between the second electrode 7D and the second terminal electrode 10b of the RFIC element 10. The extended part 60D may be configured to extend along the longitudinal direction (i.e., the Y-axis direction) beyond the formation position of the second electrode 7D. FIG. 14 shows a configuration in which the extended part 60D has a region E1 extending along the longitudinal direction (i.e., the Y-axis direction) beyond the formation position of the second electrode 7D. The facing area of the extended part 60D configured as described above facing the second portion (6b) serving as the back-surface electrode is made larger than the facing area of the second electrode 7D with respect to the second portion (6b).

In a modification of the wireless communication module 2D in the fifth embodiment, as indicated by a dashed-two dotted line in FIG. 14, the extended part 60D may be configured to have a region E2 further extending in the lateral direction (i.e., the X-axis direction) from a region E1 extending along the longitudinal direction (i.e., the Y-axis direction) beyond the formation position of the second electrode 7D.

In another modification of the wireless communication module 2D, a region E3 may be formed to surround the second electrode 7D from the region E2 extending in the lateral direction. However, an inner edge and an outer edge of the extended part 60D are linked by the cutout part (13). The formation position of the cutout part (13) may be any position linking the inner edge and the outer edge of extended part 60D.

Even in the configuration of the wireless communication module 2D in the fifth embodiment configured as described above, the effects described in the other embodiments are produced, and the module can be affixed to the metal surface 70a of the article 70 to use the metal surface 70a as an antenna, thereby performing wireless communication with high radiation efficiency to enable long distance communication.

Sixth Embodiment

The wireless communication device 1 (RFID tag) of a sixth exemplary embodiment will hereinafter be described. The wireless communication device 1 of the sixth embodiment is also configured to perform wireless communication through a high frequency signal having a UHF-band communication frequency (carrier frequency) and is configured to enable wireless communication in a wide frequency band. The wireless communication device 1 of the sixth embodiment is different from the wireless communication device 1 of the first embodiment described above in the dielectric element body. Therefore, in the description of the wireless communication device 1 of the sixth embodiment, a dielectric element body in a wireless communication module 2E will mainly be described. In the description of the sixth embodiment, the elements having the same configurations, operations, and functions as the first to fifth embodiments described above are denoted by the same reference numerals and will not be described to avoid redundant description in some cases.

Figure 15:
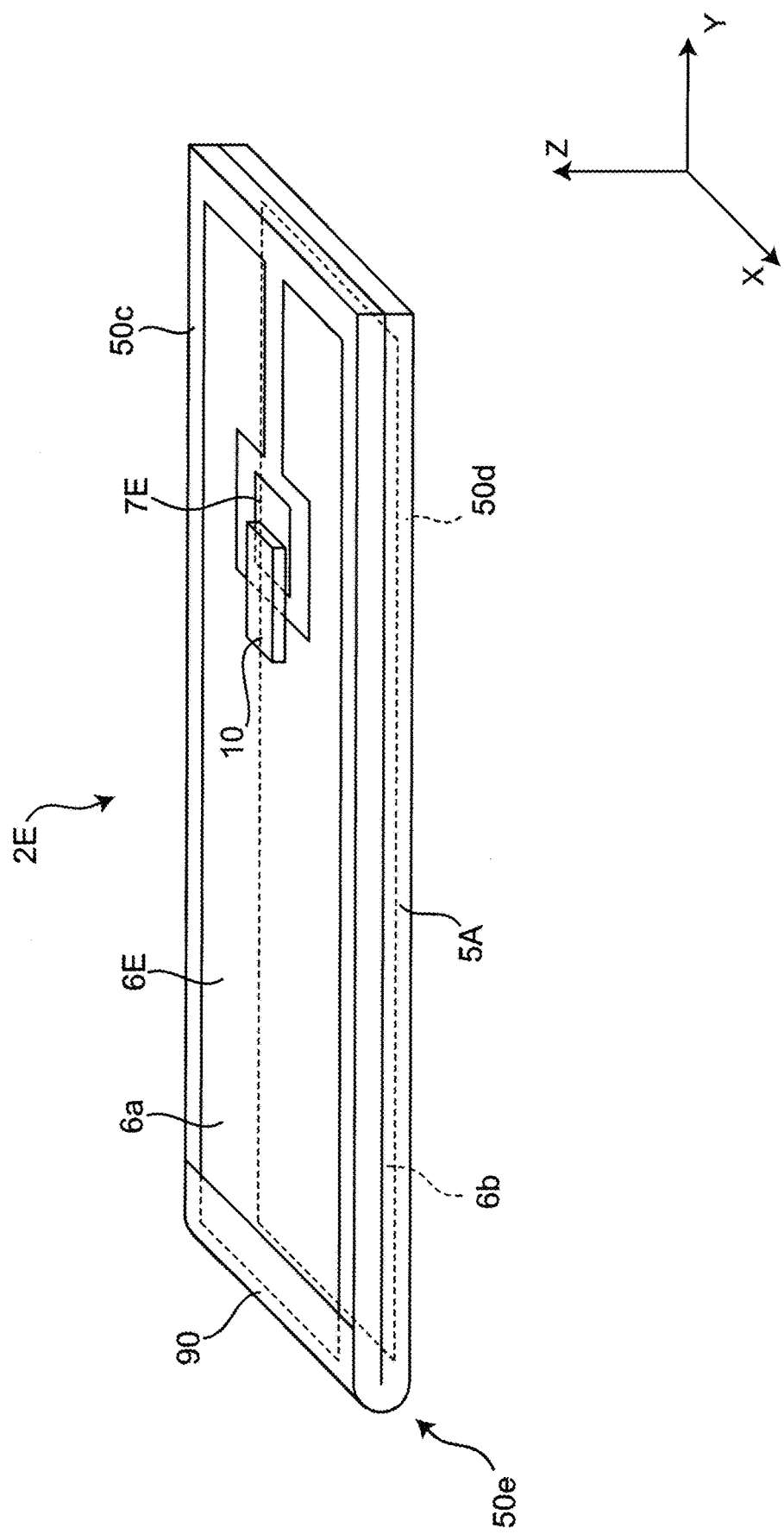
FIG. 15 is a perspective view showing a configuration of a wireless communication module in a wireless communication device of a sixth exemplary embodiment.

FIG. 15 is a perspective view showing a configuration of a wireless communication module in a wireless communication device of the sixth exemplary embodiment.

As shown in FIG. 15, in the case of the sixth embodiment, a dielectric element body 5A of the wireless communication module 2E has a belt shape and overlaps in a folded state. The first portion 6a of a first electrode 6E and a second electrode 7E are formed on one outer side surface 50c located on the outer side of the dielectric element body 5A in the folded state. The second portion 6b of the first electrode 6E is formed on the other outer side surface 50d of the dielectric element body 5A.

In the case of the sixth embodiment, the first portion 6a and the second portion 6b of the first electrode 6E are in a separate form and are separated from each other. The first portion 6a and the second portion 6b separated from each other are electrically connected via a sheet-shaped connection conductor 90 affixed to a turning part 50e of the dielectric element body 5A. Specifically, the connection conductor 90 partially overlaps with an end portion of the first portion 6a near the turning part 50e and an end portion of the second portion 6b near the turning part 50e.

The first portion 6a and the second portion 6b in the first electrode 6E may be integrated instead of being separated. In this case, the connection conductor 90 can be omitted.

Regarding the folding of the dielectric element body, the dielectric element body is not limited to being folded in two and may be folded in three. As the number of overlaps of the dielectric element body increases, a capacity can be made smaller between the first portion 6a and the second portion 6b of the first electrode 6E and between the second electrode 7E and the second portion 6b of the first electrode 6E.

According to such a configuration, the first electrode 6E, the second electrode 7E, the connection conductor 90, and the RFIC element 10 are disposed on one surface of the belt-shaped dielectric element body 5A before being folded (i.e., a surface serving as the outer side surfaces 50c, 50d in the folded state), and the dielectric element body 5A is subsequently folded in an overlapping manner. Therefore, the wireless communication module can easily be manufactured.

Even in the configuration of the wireless communication module 2E in the sixth embodiment configured as described above, the effects described in the other embodiments are produced, and the module can be affixed to the metal surface 70a of the article 70 to use the metal surface 70a as an antenna, thereby performing wireless communication with high radiation efficiency to enable long distance communication.

Seventh Embodiment

The wireless communication device 1 (RFID tag) of a seventh exemplary embodiment will hereinafter be described. The seventh embodiment is a modified form of the sixth embodiment described above. Therefore, in the description of the wireless communication device 1 of the seventh embodiment, differences from the sixth embodiment will mainly be described.

FIG. 16 is a perspective view showing a configuration of a wireless communication module in a wireless communication device of the seventh exemplary embodiment.

As shown in FIG. 16, a dielectric element body 5B of the seventh embodiment also has a belt shape and is in a folded state as with the dielectric element body 5A of the sixth embodiment described above. However, the dielectric element body 5B is not directly overlapped. Instead, a first portion 50f and a second portion 50g of the dielectric element body 5B facing each other due to folding sandwich a sheet-shaped intervening member 92 having a permittivity lower than the dielectric element body 5B. The intervening member 92 is, for example, a foamed olefin film having a permittivity of about 1.1. For example, the intervening member 92 is a member made of the same material as the dielectric element body 5B and having a higher expansion ratio than the dielectric element body 5B.

According to the exemplary aspect, the intervening member 92 that has a permittivity lower than the dielectric element body 5B is configured to make the capacity smaller between the first portion 6a and the second portion 6b of the first electrode 6F and between a second electrode 7F and the second portion 6b of the first electrode 6F. As a result, the communication distance of the wireless communication device 1 becomes longer as compared to when the intervening member 92 is not present.

Although the exemplary embodiments of the present invention have been described in detail above, these contents of disclosure of the embodiments may obviously be changed in detail of configurations, and changes in combinations and orders of elements in the embodiments may be achieved without departing from the scope and the idea of the present invention.

EXPLANATIONS OF LETTERS OR NUMERALS 1 wireless communication device (RFID tag)
2, 2A, 2B, 2C wireless communication module
3 protective case
4 sticking member
4a attachment part
5 dielectric element body
5a front surface
5b back surface
5c end surface
6, 6A, 6B, 6C first electrode
6a first portion
6b second portion (back-surface electrode)
7, 7A, 7B, 7C second electrode
8 adhesive layer
9 film base material
10 RFIC elements
10a first terminal electrode
10b second terminal electrode
11 seal material
12 opening
13, 14 cutout part
16 RFIC chip
16a first input/output terminal
16b second input/output terminal
18 display label
60, 60A, 60B, 60C extended part
61 projecting part
65 printed wiring board
67 floating electrode
70 article
70a metal surface

The invention claimed is:

1. A wireless communication device comprising:
an RFIC element including a first terminal electrode and a second terminal electrode;
a first electrode connected to the first terminal electrode; and
a second electrode connected to the second terminal electrode,
wherein the first electrode extends in both a longitudinal direction and a lateral direction and includes a first portion connected to the first terminal electrode and a second portion facing the first portion and the second electrode, and
wherein the first portion of the first lateral electrode includes an extended portion that extends in the longitudinal direction and beyond a connection point where the second electrode is connected to the second terminal electrode of the RFIC element.

2. The wireless communication device according to claim 1, wherein the extended portion of the first lateral electrode extends in the longitudinal direction beyond a formation position of the second electrode.

3. The wireless communication device according to claim 2, wherein the extended portion of the first lateral electrode includes a region that extends in the lateral direction beyond the formation position of the second electrode.

4. The wireless communication device according to claim 3, wherein the second electrode is surrounded by the extended portion of the first lateral electrode, and the extended portion of the first lateral electrode includes a cutout that links an inner edge and an outer edge of the extended portion.

5. The wireless communication device according to claim 4, wherein the second electrode includes a projecting member disposed inside the cutout.

6. The wireless communication device according to claim 4, further comprising a floating electrode disposed inside the cutout and disposed at a predetermined distance from the first electrode and the second electrode.

7. The wireless communication device according to claim 1, wherein the extended portion of the first lateral electrode comprises a facing area that faces the second portion and is larger than a facing area of the second electrode that faces the second portion of the first electrode.

8. The wireless communication device according to claim 1, wherein the second portion of the first electrode is connected on a first end of the first portion in the longitudinal direction, and the extended portion of the first lateral electrode is disposed on a second end of the first portion.

9. The wireless communication device according to claim 1, further comprising:
a dielectric element body including a front surface and a back surface,
wherein the first portion of the first electrode and the second electrode are disposed on the front surface of the dielectric element body, and
wherein the second portion of the first electrode is disposed on the back surface of the dielectric element body.

10. The wireless communication device according to claim 1, further comprising:
a folded dielectric element body,
wherein the first portion of the first electrode and the second electrode are disposed on a first outer side surface of the dielectric element body, and
wherein the second portion of the first electrode is disposed on a second outer side surface of the dielectric element body.

11. The wireless communication device according to claim 10, wherein the folded dielectric element body comprises two portions facing each other and that sandwich an intervening member having a permittivity lower than the folded dielectric element body.

12. The wireless communication device according to claim 1, wherein the first portion and the second portion comprise a single metal film.

13. The wireless communication device according to claim 1, wherein the first portion and the second portion are separately formed and connected by a connection conductor.

14. The wireless communication device according to claim 1, further comprising a seal material disposed to cover a region of connection of the first portion and the second electrode to the RFIC element.

15. The wireless communication device according to claim 1, further comprising a printable display label disposed to cover the RFIC element and the first portion and the second electrode connected to the RFIC element.

16. The wireless communication device according to claim 1, further comprising a protective case comprising a flexible material and housing at least a wireless communication module that includes the RFIC element, the first electrode, and the second electrode.

17. A wireless communication device comprising:
a main body including a front surface and a back surface;
an RFIC element disposed above the front surface of the main body and including a first terminal electrode and a second terminal electrode;
a first electrode disposed above the front surface of the main body and connected to the first terminal electrode; and
a second electrode disposed above the front surface of the main body and connected to the second terminal electrode,
wherein the first electrode extends in a lengthwise and widthwise direction of the front surface and includes an opening with the second electrode disposed in the opening, such that the first electrode surrounds at least a portion of all sides of the second electrode, and
wherein the first electrode extends in a same plane as the second electrode that is above the first surface of the main body.

18. The wireless communication device according to claim 17, wherein the main body is a dielectric element body and the first electrode includes a first portion disposed on a first outer side surface of the dielectric element body, and further includes a second portion disposed on a second outer side surface of the dielectric element body that is opposite the first outer side surface.

19. A wireless communication device comprising:
an RFIC element including a first terminal electrode and a second terminal electrode;
a first electrode connected to the first terminal electrode; and
a second electrode connected to the second terminal electrode,
wherein the first electrode extends in a same plane as the second electrode,
wherein the first electrode includes an opening with the second electrode disposed therein and includes an extended portion that extends in a longitudinal direction and beyond a connection point where the second electrode is connected to the second terminal electrode of the RFIC element.

20. The wireless communication device according to claim 19, further comprising a dielectric element body, with the first electrode including a first portion disposed on a first outer side surface of the dielectric element body and a second portion disposed on a second outer side surface of the dielectric element body that is opposite the first outer side surface.

\* \* \* \* \*